US011469836B2

(12) United States Patent
Lee et al.

(10) Patent No.: US 11,469,836 B2
(45) Date of Patent: Oct. 11, 2022

(54) METHOD FOR MEASURING MAGNITUDE OF RADIO WAVE ALONG A SUBWAY LINE, AND AN APPARATUS FOR SAID METHOD

(71) Applicant: AIMIFY INC., Seoul (KR)

(72) Inventors: Kwang Ju Lee, Yongin-Si (KR); Jun Seok Song, Seoul (KR)

(73) Assignee: AIMIFY INC., Seoul (KR)

( * ) Notice: Subject to any disclaimer, the term of this patent is extended or adjusted under 35 U.S.C. 154(b) by 341 days.

(21) Appl. No.: 16/762,576

(22) PCT Filed: Nov. 6, 2018

(86) PCT No.: PCT/KR2018/013369
§ 371 (c)(1),
(2) Date: May 8, 2020

(87) PCT Pub. No.: WO2019/093733
PCT Pub. Date: May 16, 2019

(65) Prior Publication Data
US 2020/0266906 A1  Aug. 20, 2020

(30) Foreign Application Priority Data
Nov. 8, 2017 (KR) .......................... 10-2017-0148282

(51) Int. Cl.
*H04L 12/28* (2006.01)
*H04B 17/318* (2015.01)
(Continued)

(52) U.S. Cl.
CPC ............ *H04B 17/318* (2015.01); *G01P 15/00* (2013.01); *G06T 7/20* (2013.01); *G10L 25/18* (2013.01);
(Continued)

(58) Field of Classification Search
CPC ..... G10L 15/30; G10L 25/18; G01S 7/52026; H04W 52/0225
(Continued)

(56) References Cited

U.S. PATENT DOCUMENTS 4,209,843 A * 6/1980 Hyatt .................. G05B 19/408
708/422
7,376,556 B2 * 5/2008 Bennett .................... G09B 7/00
704/E15.047
7,647,225 B2 * 1/2010 Bennett ................... G06F 40/58
704/270.1

FOREIGN PATENT DOCUMENTS

JP  8-105792 A  4/1996
JP  2000-004501 A  1/2000
(Continued)

OTHER PUBLICATIONS

International Search Report dated Feb. 25, 2019, in connection with corresponding International Patent Application No. PCT/KR2018/013369.

*Primary Examiner* — John Pezzlo
(74) *Attorney, Agent, or Firm* — Hauptman Ham, LLP

(57) ABSTRACT

The measuring apparatus according to the present invention searches each of subbands divided from a target band set with respect to the Frequency Distribution Information (FDI) obtained periodically to find a unit band corresponding to a maximum frequency component among unit bands pertaining to said each subband; marks the found unit band as a Dominant Unit Band (DUB); organizes a DUB distribution table by collecting a plural pieces of the FDI as much as a predetermined time; checks a distribution locus of DUBs on the organized DUB distribution table. And, if it is confirmed that the DUB distribution table shows a specific distribution pattern corresponding to an acceleration sound, etc., the measuring apparatus makes a measured intensity to
(Continued)

be identified as an intensity measured at a start position of a platform or a tunnel section, based on the time when the specific distribution pattern appears.

20 Claims, 10 Drawing Sheets

(51) Int. Cl.
*G01P 15/00* (2006.01)
*G06T 7/20* (2017.01)
*G10L 25/18* (2013.01)
*G10L 25/51* (2013.01)
*H04J 1/16* (2006.01)

(52) U.S. Cl.
CPC .... *G10L 25/51* (2013.01); *G06T 2207/30252* (2013.01)

(58) Field of Classification Search
USPC ................................ 370/252, 329, 386, 430
See application file for complete search history.

(56) References Cited

FOREIGN PATENT DOCUMENTS

| | | |
|---|---|---|
| JP | 2004-286562 A | 10/2004 |
| KR | 10-2010-0128855 A | 12/2010 |
| KR | 10-1303566 B1 | 9/2013 |

* cited by examiner

Note
- $f_{DivB\_k}$ : a subband partitioned by a set of a certain number of unit bands
- ▢ : an MDB (a narrow unit band, divided from a target band, of a certain bandwidth)
- ▩ : a dominant MDB with the highest power in each subband ($f_{DivB\_k}$)

METHOD FOR MEASURING MAGNITUDE OF RADIO WAVE ALONG A SUBWAY LINE, AND AN APPARATUS FOR SAID METHOD

CROSS-REFERENCE TO RELATED APPLICATION

This present application is a national stage filing under 35 U.S.C. § 371 of PCT application number PCT/KR2018/013369 filed on Nov. 6, 2018 which is based upon and claims the benefit of priority to Korean Patent Application No. 10-2017-0148282 filed on Nov. 8, 2017 in the Korean Intellectual Property Office. The disclosures of the above-listed applications are hereby incorporated by reference herein in their entireties.

TECHNICAL FIELD

The present invention relates to method and apparatus being capable of measuring radio waves such as electromagnetic waves, particularly radio waves in tunnels and underground stations on board a subway being in service.

DESCRIPTION OF THE RELATED ART

Electromagnetic waves occur not only in electric appliance that we use, but also in transportation means such as a subway, power lines, and mobile phones, etc. so that it is practically difficult to avoid exposure to electromagnetic waves in daily life.

Electromagnetic waves have been reported to cause headache, dizziness, muscle aches and stress in a person if exposed for a long time, and may cause a fatal disease such as cancer if exposure to electromagnetic waves is sustained.

Due to such risk of electromagnetic waves, people consciously make efforts to escape the influence of electromagnetic waves, such as trying to stay as far away from electric appliance as possible in daily life, or to prepare products or plants known to absorb electromagnetic waves.

However, it is practically difficult to be free from the influence of electromagnetic waves in the social life even by such individual efforts of people. For example, when using a transportation system such as a subway, it is inevitable to be exposed to electromagnetic waves generated in such transportation means and operating facilities.

Therefore, in order to protect citizens' health from electromagnetic waves, it is necessary for national and/or local government or public institutions to suppress the electromagnetic waves generated from such public facilities. In recent years, research has been reported on the fact that subways operating in Seoul emit electromagnetic waves five times higher than the international standard, so that the necessity of suppressing electromagnetic waves is further highlighted.

However, for the public health, it is important to measure the intensity of the electromagnetic wave, generated in the public facilities, especially the closed underground space of the traffic facilities, first in order to suppress the generation of electromagnetic waves. It is also very important to know how much electromagnetic field strength is detected in which space. This is because the time it takes for citizens to stay on the move depends on the type of the underground space and the harmful standard level of the electromagnetic wave intensity that is determined for allowable exposure changes according to staying time. In other words, in the case of subway, the harmful standard levels in the underground station, i.e., platform, where citizens wait for electric trains, and the tunnel sections, where the passengers pass on board an electric train, may be managed differently.

For this reason, it is necessary to measure the electromagnetic wave as distinguishing the underground stations, that is, platforms and the tunnel sections of the service route of subway. In the conventional method of measuring electromagnetic waves as being distinguished between underground stations and tunnel sections, an electromagnetic wave measuring equipment is loaded in an electric train so that the electric wave can be measured while the electric train is traveling along the route, and each time an electric train enters a tunnel section and enters a platform (that is, gets out of a tunnel section), an operator of the measuring equipment manually applies a signal to the measuring equipment to mark the boundary between the tunnel section and the underground station in recorded intensities of the electromagnetic wave being measured.

However, in such a passive method of distinguishing between underground stations and tunnel sections, it is difficult to determine a boundary to be matched exactly with the criteria (for example, a position at a specified distance of several meters from the end of platform) set for the boundary. And the boundary to be marked may vary from one station to another, which causes a problem in consistency. Furthermore, if the measurement information, which is obtained as the boundary position is considerably delayed set due to the operator's mistake or carelessness, was used, there would be a problem in the electromagnetic wave management for the platform, etc.

In order to obtain the measured electromagnetic wave intensity information as exactly distinguishing the underground station and the tunnel section in the conventional method of designating the boundary by manual operation of the operator, measuring work is conducted repeatedly several times until the boundary positions between the underground station and the tunnel section appear to be determined consistently. However, since only Seoul has hundreds of subway stations, it is not feasible to measure repeatedly with manual markings of the operator so that the boundaries of underground platforms may be determined uniformly for each station.

SUMMARY OF THE INVENTION

One object of the present invention is to provide a method and an apparatus for measuring radio wave intensities along a service route of subway while automatically distinguishing a boundary between an underground station and a tunnel section.

Another object of the present invention is to provide a method and an apparatus for distinguishing a boundary between an underground station and a tunnel section based on sounds generated from a running electric train and its surroundings.

A yet another object of the present invention is to provide a method and an apparatus for exactly distinguishing a boundary between an underground station and a tunnel section while moving on board a subway in service.

The scope of the present invention is not necessarily limited to the above explicit statements. Rather, the scope of the present invention covers anything to accomplish effects that could be derived from the specific and illustrative explanations of the present invention below.

A measuring apparatus for measuring a radio wave along a service route of subway in a running electric train in accordance with one aspect of the present invention, comprises: a sound analyzing unit configured to obtain, every predetermined interval, frequency distribution information of sound for the predetermined interval, the sound being generated around the apparatus; a storage unit configured to store measured information; and a control unit configured to receive measured intensity of radio wave and to store the measured intensity in the storage unit together with information on measurement time, with respect to the frequency distribution information obtained periodically, to search each of subbands divided from a target band to find a unit band corresponding to a maximum frequency component among unit bands, each with a designated bandwidth, pertaining to said each subband, and to mark the found unit band as a Dominant Unit Band (DUB), to check a distribution locus of DUBs on a DUB distribution table organized by collecting a plural pieces of the frequency distribution information as much as a predetermined time, in order to confirm whether the distribution locus matches with a preset intrinsic pattern, each of said plural pieces of the frequency distribution information, in the DUB distribution table, consisting of the subbands, each containing the marked DUB, if the distribution locus matches with a preset intrinsic pattern, to determine a time point later by a designated time interval, based on a time at which the matching distribution locus appears, as a boundary time point, and to record information for causing a radio wave intensity, which has the information on measurement time closest to the determined boundary time point among measured intensities stored in the storage unit, to be identified as an intensity measured at a start position of a platform or a tunnel section.

In an embodiment according to the present invention, the control unit records information for causing a radio wave intensity, which has the information on measurement time closest to the determined boundary time point, to be identified as an intensity measured at a start position of a tunnel section, in case a distribution locus of DUBs matching with a first intrinsic pattern preset for a sound to be generated when an electric train accelerates is detected from any one of DUB distribution tables being organized, or as an intensity measured at a start position of a platform, in case a distribution locus of DUBs matching with a second intrinsic pattern preset for a sound to be generated when an electric train decelerates is detected.

In an embodiment according to the present invention, the control unit determines the boundary time point by applying length of the time interval differently depending on an additional condition of whether a specific signal caused from a sound to be generated in an electric train just prior to start has been detected or not before detection of a distribution locus of DUBs matching with the first intrinsic pattern, in case the distribution locus matching with the first intrinsic pattern is detected from said any one of the DUB distribution tables.

In an embodiment according to the present invention, the control unit determines the boundary time point by applying length of the time interval differently depending on an additional condition of whether a specific signal caused from a sound to be generated in an electric train just after stop is detected or not within a specified time after detection of a distribution locus of DUBs matching with the second intrinsic pattern, in case the distribution locus matching with the second intrinsic pattern is detected from said any one of the DUB distribution tables.

In the above embodiments, the specific signal is a specific sound that is generated to notify passengers that an electric train is going to start or has stopped, and the control unit may judge detection of the specific sound based on whether a distribution locus of DUBs matching with a third intrinsic pattern preset for the specific sound is detected from the DUB distribution tables being organized. Further, the control unit may apply a first condition in case of organizing DUB distribution tables to find a distribution locus of DUBs matching with the first intrinsic pattern and the second intrinsic pattern, and a second condition in case of organizing DUB distribution tables to fine a distribution locus of DUBs matching with the third intrinsic pattern wherein the first condition and the second condition specify bandwidth of the subband and the target band differently from each other.

In addition, in the above embodiments, the specific signal is a change in magnitude of a sound heard inside a carriage of an electric train when its doors are opened or closed, and the control unit may determine that the specific signal is detected when a surrounding sound detected by the sound analyzing unit changes more than a threshold value within a predetermined period of time. In this case, the predetermined period of time may be equal to the predetermined interval, and the control unit calculates a total sound intensity of each of both halves of the predetermined period of time and determines that the specific signal is detected when the total sound intensity of one half is greater than that of the other half by the threshold value. In the present invention, the control unit determines that the specific signal is detected due to closing of doors of an electric train when the total sound intensity of a preceding half of said both halves is greater than that of a following half of said both halves by the threshold value, and that the specific signal is detected due to opening of doors of an electric train when the total sound intensity of the preceding half is smaller than that of the following half by the threshold value.

In an embodiment according to the present invention, the control unit records station identification information (e.g., station name or number) that uniquely identifies a subway station corresponding to a platform with respect to measured intensities from a measured radio wave intensity, which information indicative of measurement at a start point of the platform is recorded in relation with, to another measured radio wave right adjacent to a measured intensity which information indicative of measurement at a start point of a tunnel section is recorded in relation with. In the present invention, the measuring apparatus may further comprises a communication unit being capable of communicating with an Access Point (AP) providing a wireless communication network locally within a limited area according to a specific signaling method. In this case, the control unit obtains the station identification information for the corresponding platform through searching a list of APs, which have been installed in platforms of subway stations, for an identifier of a certain AP provided by the communication unit. Alternatively, the measuring apparatus may further comprise a photographing unit configured to take pictures outside a window of an electric train, and an image analyzing unit configured to apply a character recognition algorithm to the pictures being taken to extract character information therefrom. In this case, the control unit uses the extracted character information as the station identification information. In addition, the image analyzing unit may be further configured to obtain a motion vector of an image frame from the pictures being taken. In this case, it may extract the character information from the pictures while magnitudes of the motion vectors obtained sequentially for a predetermined time or more are kept at 0.

In an embodiment according to the present invention, the control unit checks whether or not an arbitrary AP of which identification information is provided from the communication unit is an AP installed in a platform of a subway station; determines time point, which is a designated offset time apart from a time at which the arbitrary AP is detected, as a boundary time point if it is confirmed that the arbitrary AP is installed in a platform; and records information for causing a radio wave intensity, which has the information on measurement time closest to the boundary time point determined by reflecting the offset time among measured intensities stored in the storage unit, to be identified as an intensity measured at a start position of a platform. Further, the control unit uniquely identifies the platform where the arbitrary AP is installed, and uses time information pre-designated for the identified platform as the offset time, thereby applying the offset time differently to each platform.

In an embodiment according to the present invention, the measuring apparatus further comprises a sensor for detecting magnitude of acceleration acting on the apparatus. In this embodiment, the control unit determines the boundary time point, in case a distribution locus of DUBs matching with the intrinsic pattern is detected from any one of DUB distribution tables being organized, by applying length of the time interval differently depending on an additional condition of whether steady change of the acceleration magnitude for a predetermined time or more is detected before or after a detection time of the distribution locus.

In another embodiment according to the present invention, the measuring apparatus may further comprises the aforementioned photographing unit and an image analyzing unit configured to obtain a motion vector of an image frame from pictures being taken. In this case, the control unit determines the boundary time point, in case a distribution locus of DUBs matching with the intrinsic pattern is detected from any one of DUB distribution tables being organized, by applying length of the time interval differently depending on an additional condition of whether the motion vectors being obtained sequentially before or after a detection time of the distribution locus are steadily changed in magnitude for a predetermined time or more. In the present embodiment, the image analyzing unit may set an upper region for image frames of the pictures being taken, and obtain motion vectors from the set region of the image frames, in case brightness of the pictures is greater than or equal to a predetermined level.

In the above-described embodiments, the control unit applies the time interval to determination of the boundary time point after setting the time interval to be longer when the aforementioned additional condition is not satisfied as compared with when the additional condition is satisfied.

In an embodiment according to the present invention, the target band is set to have a bandwidth narrower than entire bandwidth of the frequency distribution information for audible sounds being obtained by the sound analyzing unit.

In an embodiment according to the present invention, the distribution locus of DUBs matching with the intrinsic pattern has a pattern that DUBs are linearly increased or decreased for at least a pre-designated time width in the organized DUB distribution table.

In an embodiment according to the present invention, the control unit is configured to be capable of applying the time interval to determination of the boundary time point after setting the time interval differently depending on input information that is indicative of which carriage, on an electric train, the apparatus is placed in for measuring a radio wave.

In an embodiment according to the present invention, each of the subbands has a bandwidth within a range of 200 to 400 Hz.

In an embodiment according to the present invention, the measuring apparatus may further comprise a radio wave measuring unit. This radio wave measuring unit may be detachably connected to or integrated into the apparatus. The former case may be configuration for measuring intensity of a low frequency electromagnetic wave, which is abbreviatedly called as ELF or ELFMW, and the latter case may be configuration for measuring intensity of radio signals for providing mobile communication.

In an embodiment according to the present invention, the control unit organizes the DUB distribution table in such a manner that 70% or more of the DUB distribution table includes pieces of frequency distribution information having been included in latter portion of a DUB distribution table organized just before.

A method for automatically measuring a radio wave along a service route of subway in a running electric train in accordance with another aspect of the present invention, comprises: a first step of continuously measuring intensity of a received radio wave, and storing each measured intensity together with information on a corresponding measurement time; and a second step of determining an intensity, which is measured at a start position of a platform or a tunnel section, among the stored intensities based on a sound generated in surroundings. The second step may comprise: a step of obtaining, every predetermined interval, frequency distribution information of the sound for the predetermined interval; a step of searching each of subbands divided from a target band set with respect to the frequency distribution information obtained periodically to find a unit band corresponding to a maximum frequency component among unit bands, each with a designated bandwidth, pertaining to said each subband, and to mark the found unit band as a DUB, and of organizing a DUB distribution table by collecting a plural pieces of the frequency distribution information as much as a predetermined time, each of said plural pieces of the frequency distribution information, in the DUB distribution table, consisting of the subbands, each containing the marked DUB; a step of checking a distribution locus of DUBs on the organized DUB distribution table in order to confirm whether the distribution locus matches with a preset intrinsic pattern, and of determining a time point later by a designated time interval, based on a time at which the matching distribution locus appears, as a boundary time point if the distribution locus matches with the preset intrinsic pattern; and a step of recording information for causing an intensity, which has the information on measurement time closest to the determined boundary time point among the stored intensities, to be identified as an intensity measured at the start position of a platform or a tunnel section.

The present invention described above or at least one embodiment of the present invention to be described in detail below with reference to appended drawings guarantees measuring the intensity of the radio waves, especially the harmful electromagnetic waves or the radio waves propagated by the mobile communication network, along a service route of subway, as automatically distinguishing between a underground station section and a tunnel section. Therefore, it has the advantages that there are no errors or mistakes in specifying the boundaries with respect to the measured information, and that divisions of the underground station and the tunnel section are made exactly and uniformly according to a given rule for boundary position, in comparison with the conventional method in which stations and tunnels are distinguished manually.

Accordingly, a subway operating institution or subway corporation, or public institution or a local government or the like responsible for the management of underground spaces can rely on boundary positions marked within the measured electromagnetic wave intensity information with indications of boundaries between underground stations and tunnel sections that are determined by the present invention. And, it is possible to separate the countermeasures for the subway platform and the countermeasures for the tunnel section, thereby enabling more efficient shielding of electromagnetic waves from the standpoint of equipment, manpower, or budget.

In addition, a mobile communication network operator who wishes to relay a radio signal for a mobile communication service along a subway route can also decide what extent the relay facility should be invested or extended to either the platform or the tunnel section, in consideration of the frequency of subscribers' use of telecommunication services and facility investment cost etc., based on the measured radio wave intensity information with indications of boundaries between underground stations and tunnel sections that are determined by the present invention, so that cost reduction and efficient investment are possible.

DETAILED DESCRIPTION

Figure 1:
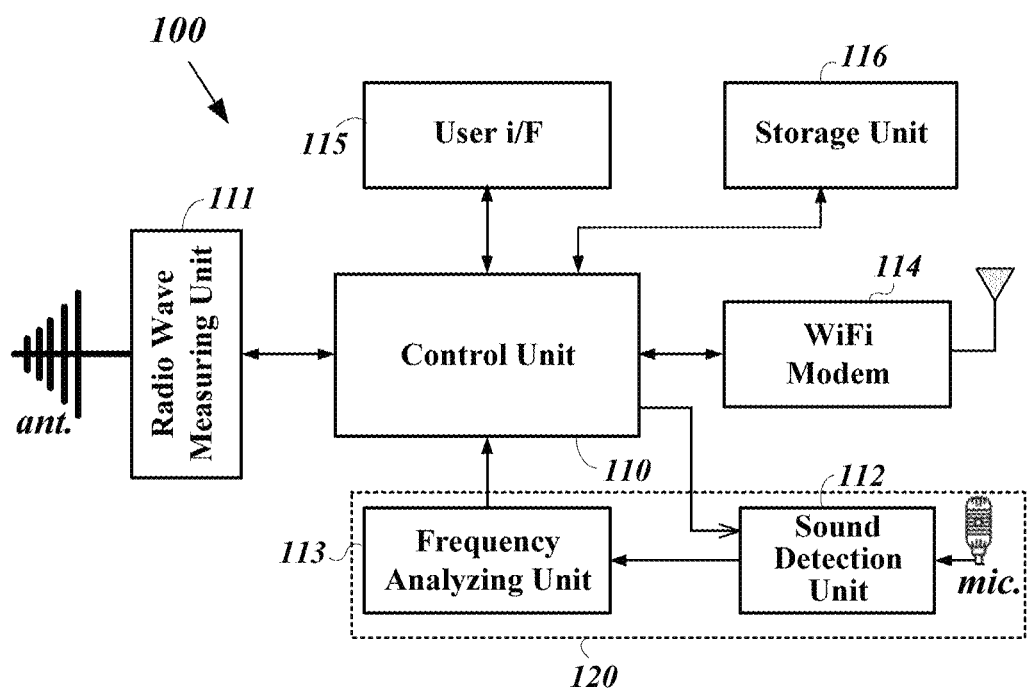
FIG. 1 is a diagram illustrating a configuration of an embodiment of an apparatus for conducting a method of measuring radio wave intensity along a service route of subway while distinguishing between an underground station and a tunnel section according to the present invention.

In what follows, embodiments of the present invention will be described in detail with reference to appended drawings.

In the following description of the embodiments of the present invention and the accompanying drawings, the same reference numerals or symbols designate the same elements unless otherwise specified. Of course, for convenience of explanation and for the sake of understanding, the same components may be indicated by different reference numbers or symbols if necessary.

FIG. 1 illustrates a block diagram of an apparatus for measuring the intensity of a radio wave along a subway route as distinguishing between an underground station and a tunnel section according to an embodiment of the present invention.

As shown in the figure, a measuring apparatus 100 configured according to an embodiment of the present invention comprises: a radio wave measuring unit 111 for measuring the intensity of a radio wave of a designated band, for example, a harmful electromagnetic wave; a sound analysis unit 120 for detecting a sound generated around the measuring apparatus, converting it into an electrical signal, and analyzing the converted electrical signal; a WiFi modem 114 constituting a communication unit for transceiving data through a WiFi wireless LAN (hereinafter, referred to as a 'WiFi network') by modulating data into an RF signal or demodulating an RF signal according to a specified signaling protocol of the communication network, namely, a WiFi network that provides wireless data services for a local area; a storage unit 116 for storing data necessary for the radio wave measuring operation and information on the measured radio wave intensities and the like; an interface unit 115 for receiving an operator's input through a prepared input means (for example, a keyboard, a touch pad, etc.), and presenting necessary information visually through a prepared display means; and a control unit 110 for controlling the measuring operation of the radio wave measuring unit 111, identifying those, which are measured when an electric train enters a tunnel section (or an underground station) and escapes therefrom, from a series of radio wave intensities being measured based on the frequency information provided by the frequency analyzing unit 113 through the sound analysis, and conducting input/output, associated with the measuring and identifying, via the interface unit 115.

The sound analysis unit 120 includes a sound detection unit 112, such as a microphone or a sound pickup unit, for converting a sound into an electrical signal, and a frequency analyzing unit 113 for analyzing the frequency components of the converted electrical signal.

The radio wave measuring unit 111 may not be integrated into the measuring apparatus 100. In this case, when the radio wave measurement is required, the radio wave measuring unit 111 is detachably connected through an appropriate signal exchange interface prepared in the measuring apparatus 100, and then performs intensity measurement with respect to the received radio wave under the control of the control unit 110.

The control unit 110 may be configured to conduct various operations to be described below together with peripheral hardware elements included therein by executing pre-stored instruction codes such as firmware included therein. The other components 111 and 113 are the same. In order to help understanding of the concept and the subject of the present invention, although the components of the measurement apparatus 100 are functionally divided as illustrated in FIG. 1, they may be decomposed into more detailed components as necessary, or some of the components may be optionally combined to form a single component. According to an embodiment of the present invention, components not shown in the figure are further included to constitute the measurement apparatus 100 or the measurement apparatus 100 may be configured without one of the depicted components, for example the WiFi modem 114.

Figure 2:
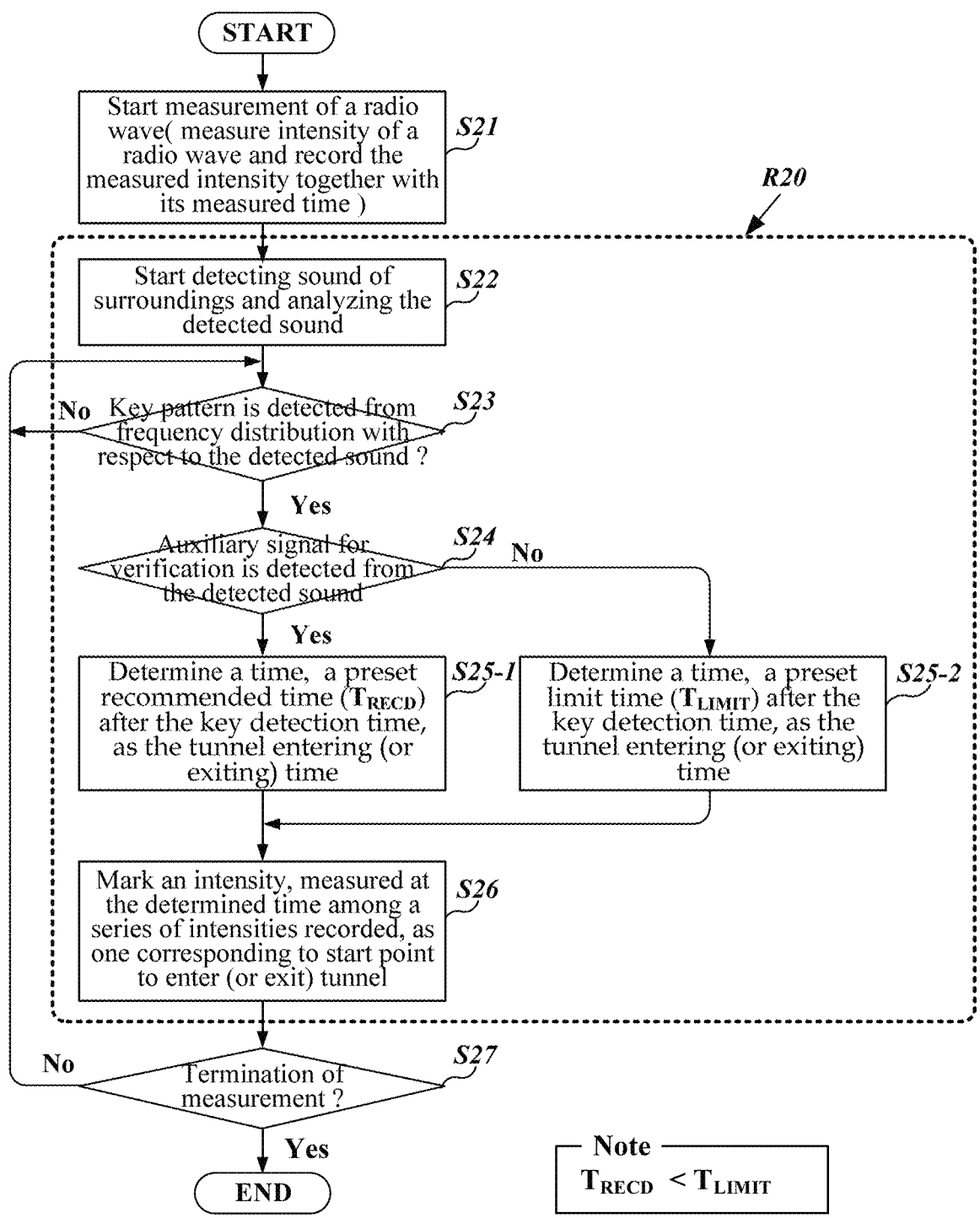
FIG. 2 is a flowchart of a method for measuring the intensity of radio waves on a subway route while distinguishing between an underground station and a tunnel section according to an embodiment of the present invention.

Hereinafter, the method, which is conducted by the measurement apparatus 100 configured as illustrated in FIG. 1 in accordance with the procedure illustrated in FIG. 2, of measuring the radio wave intensity (abbreviated as 'RWI') along the service route of subway as distinguishing between an underground station and a tunnel section will be described in detail.

In the present specification, under the assumption that a harmful electromagnetic wave (for example, Extremely Low Frequency Electromagnetic Wave which is commonly abbreviated as 'ELF' or 'ELFMW') generated along an underground route, which a subway is traveling on, is to be measured, a variety of embodiments of the present invention will be described in detail. However, the technical idea and concept of the present invention are not limited to the electromagnetic waves which are harmful to the human body, as described above. Therefore, if the claims of the present invention do not explicitly exclude an object to be measured, the scope of the right, of course, shall also extend to the technology of measuring other type of radio wave (for example, a radio wave of signals of mobile communication relayed into underground), other than harmful electromagnetic waves, as distinguishing between an underground station (hereinafter also referred to as 'platform') and a tunnel section (hereinafter referred to as 'tunnel').

According to an embodiment of the present invention, in case that the measuring apparatus 100 is configured to measure radio waves of wireless signals for mobile communication, the radio wave measuring unit 111 may be integrated with the measuring apparatus 100. In the present embodiment, the radio wave measuring unit 111 may be a communication module (e.g., a device including an LTE modem) being capable of measuring the strength of the wireless signal of the mobile communication network, and functioning to connect to the mobile communication network and perform actual data communication with the other party as well.

In order to conduct measurement of radio waves (abbreviated as 'MoRW') according to a method of the present invention, an operator first boards a subway train together with the measurement apparatus 100. At this time, it is preferable to ride in a carriage corresponding to a specified order (for example, first or fourth) from the head of the electric train. This reason will be described below.

Of course, an operator can board a carriage in a certain order other than the recommended carriage. In this case, it is preferable to set the information on the order of the boarding carriage again to the control unit 110 through the interface unit 115.

After the preparation for MoRW is completed, the operator who has boarded the electric train in service sets the necessary ancillary information, for example, subway line information etc. through the interface unit 115, and commands to start MoRW. Then, the control unit 110 receives the start command from the interface unit 115, and instructs the radio wave measuring unit 111 to start MoRW in response to the received start command. At the same time, it activates the communication function of the WiFi modem 114 and the detection function of the sound detection unit 112.

If start of MoRW is commanded, the radio wave measuring unit 111 continuously measures RWI received via a prepared antenna and transmits values indicating the measured RWIs sequentially to the control unit 110. Each time the measured RWI is receive, the control unit 110 records the measured RWI in the storage unit 116 as one measured entry 301 together with the information on the time point at which the measured RWI is received, that is, the measurement time. As a result, a measurement table 300, which the measurement information is filled in as illustrated in FIG. 3, is created (S21).

Meanwhile, while the operation for measuring and recording the RWIs is continuously conducted, the control unit 110, together with the frequency analysis unit 113, analyzes a sound detected around the measurement apparatus 100 to check whether a specific sound or audio is included therein (S22).

In order to analyze the ambient sound, the sound detection unit 112 detects a sound (which may be generated by an electric train itself or inside or outside the electric train) generated around the measurement apparatus 100, that is, heard inside a carriage of the electric train being in service, and applies signals of the detected sound to the frequency analysis unit 113 at the subsequent stage.

Figures 3, 4:
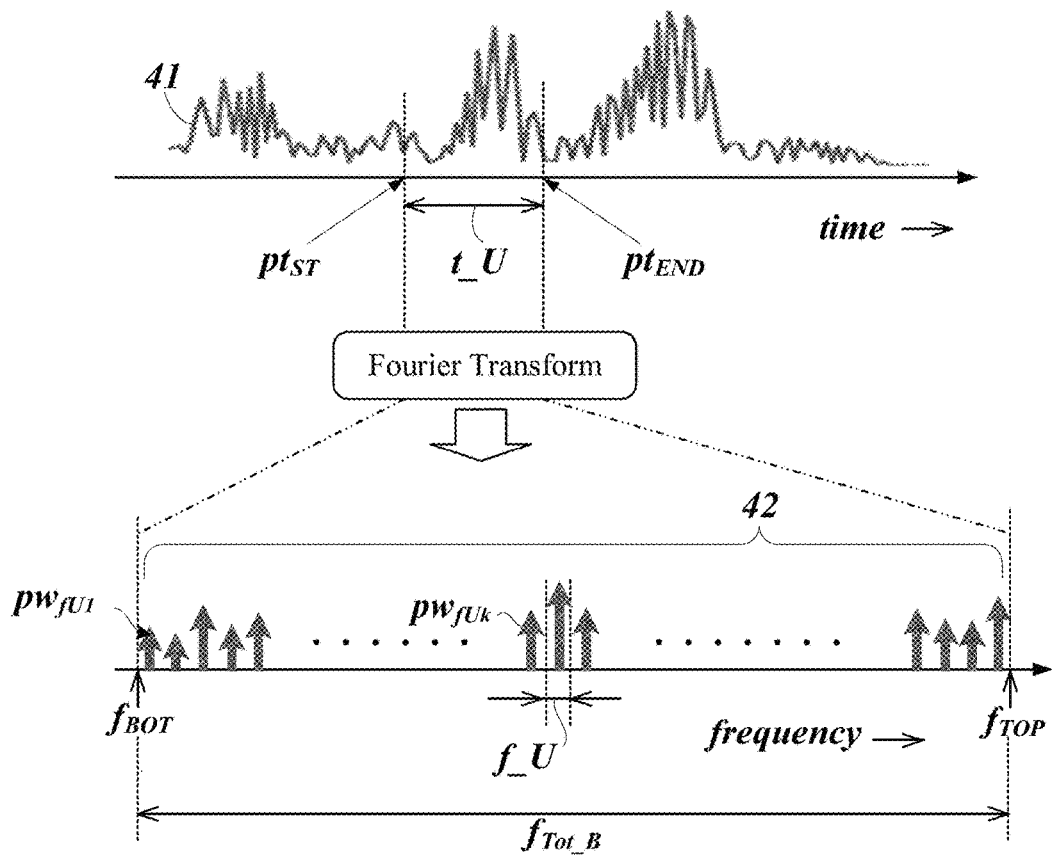
FIG. 3 is an example of a measurement table in which electromagnetic wave intensities being measured are recorded together with information indicating a boundary position between the underground station and the tunnel section according to an embodiment of the present invention.
FIG. 4 schematically shows acquisition of a frequency spectrum at regular intervals with respect to sounds generated from or around a running subway train and calculation of the magnitude of a frequency component for each specified bandwidth unit according to an embodiment of the present invention.

While sampling the applied electrical signals 41 of sound at a specified sampling rate, for example, 22,000 Hz, as illustrated in FIG. 4, the frequency analyzing unit 113 conducts a Fourier transform with the signals sampled during the pre-specified conversion period t_U, for example, 0.05 second every the conversion period, and converts to frequency components 42 (these are called as 'sound spectrum' hereinafter) on the search band $f_{Tot\_B}$ for analysis, for example, the audible frequency band.

The frequency analyzing unit 113 first subdivides the search band $f_{Tot\_B}$ into unit bands of a predetermined narrow bandwidth, for example, 10 Hz, and calculates the magnitude ($pw_{fUk}$, k=1, 2,) of a frequency component for each unit band f_U (this unit band is called as 'MDB' (Minutely-Divided Bandwidth) in this specification) that is obtained from the subdivision. The calculated magnitude of a frequency component pertaining to an arbitrary MDB is called as PoMDB (Power of Minutely-Divided Bandwidth) in this specification. Next, the frequency analyzing unit 113 obtains a vector of PoMDBs (abbreviated as PoMDB vector, hereinafter), which is information showing how the frequency components of the detected sound are distributed in unit of MDB. The PoMDB vector is an array in which the calculated PoMDBs are arranged in the order from low frequency to high frequency. Finally, the obtained PoMDB vector is transmitted to the control unit 110 together with information on the time point ptsT or ptEND when the sound, which the PoMDB vector is obtained from, is detected.

Figure 5:
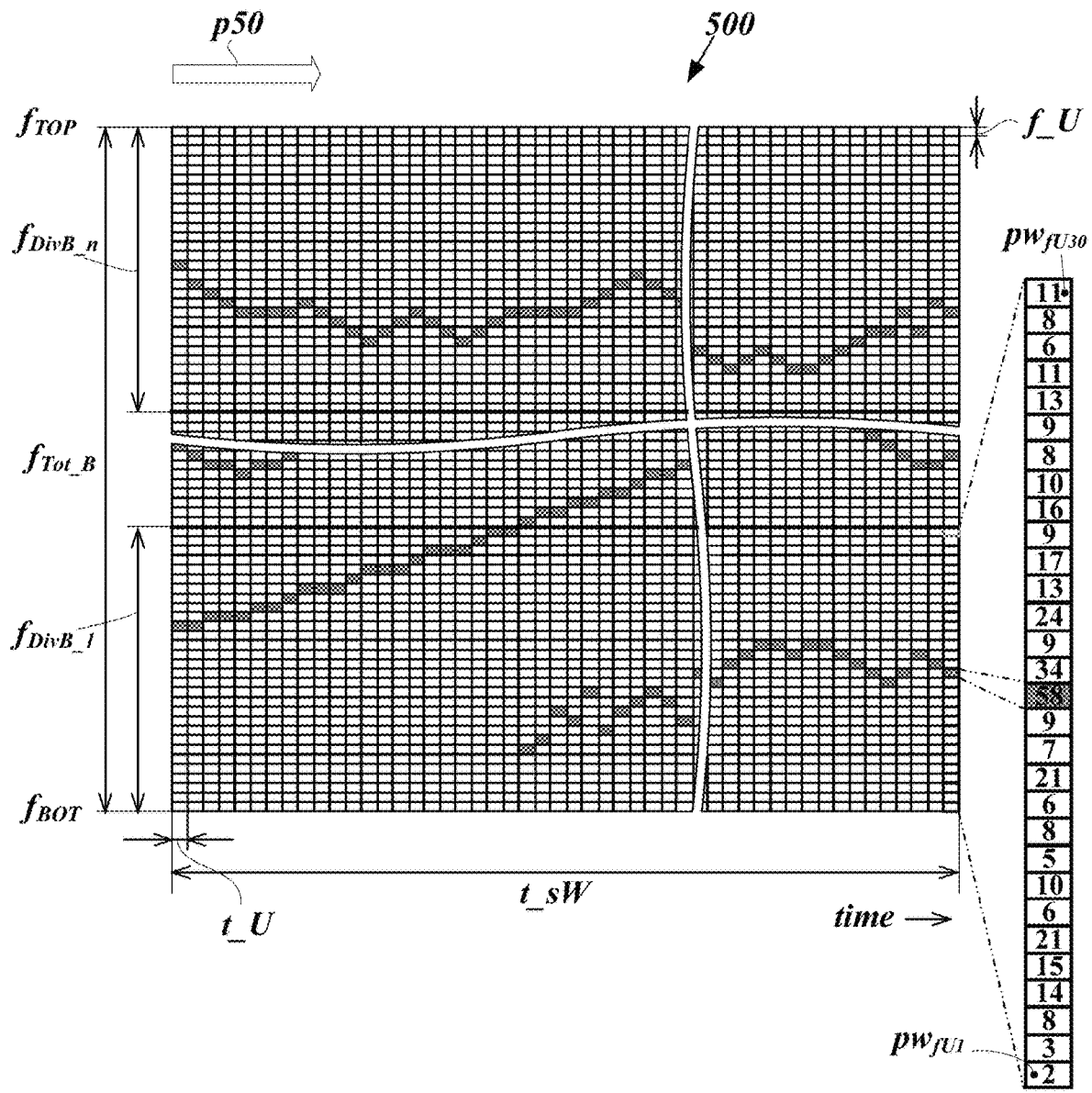
FIG. 5 illustrates an exemplary distribution diagram where only the minutely-divided bandwidths of the maximum power are marked distinguishably for each subband by conducting maximization by subband with respect to a series of power vectors, each consisting of a set of minutely-divided bandwidths, obtained over a period of time according to an embodiment of the present invention.

While collecting a series of the PoMDB vectors (p50), each delivered every a pre-specified conversion period t_U from the frequency analyzing unit 113, in the delivered order in such a manner that MDBs of the same frequency are arranged right adjacently each other as illustrated in FIG. 5, the control unit 110 conducts a locally-maximizing process (abbreviated as LMP hereinafter) for each PoMDB vector. The time information ptsT or ptEND provided together with each PoMDB vector is recorded in association with the corresponding PoMDB vector.

In the present specification, the LMP means the operation that divides a single PoMDB vector into groups of a pre-specified number of MDBs, searches MDBs pertaining to each group for a special MDB with the highest power (this special MDB is called as 'dominant MDB' hereinafter) among powers ($pw_{fUk}$, k=1, 2, 3, ... ) of those MDBs, and marks the found special MDB (i.e., a dominant MDB) to be distinguished from others.

The control unit 110 may adaptively set the number of MDBs to be grouped into one group in order to apply LMP. The number of MDBs to be set like that is determined based on how wide the subband $f_{DivB}$ is, where the subbands ($f_{DivB\_k}$, k=1, 2, 3 ... ), each being a group from which a single dominant MDB is selected, are divided from the search band $f_{Tot\_B}$ (which is a band with $f_{BOT}$ as the minimum frequency and $f_{TOP}$ as the maximum one). Under the assumption that a single MDB has a bandwidth of 10 Hz, in order to find a dominant MDB for each subband ($f_{DivB\_k}$, k=1, 2, 3, ... ) of 300 Hz for example, the number of MDBs to be grouped is set to 30, and then the LMP is applied to each group of 30 MDBs.

While collecting the PoMDB vectors in sequential manner as described above, the control unit 110 partitions the collected PoMDB vectors as one table 500 where dominant MDBs are distributed in an arbitrary pattern (the table 500 thus partitioned is called as dominant distribution table, or abbreviated as DDT, hereinafter), when the number of the PoMDB vectors being collected reaches the predetermined value. The PoMDB vectors, already delivered or to be delivered later from the frequency analyzing unit 113, subsequent to the current partitioned DDT (Dominant Distribution Table) are to be included in another DDT that will be partitioned next.

The number of PoMDB vectors constituting one DDT 500 is determined depending on a time width suitable for detecting a frequency distribution pattern for a specific sound. Under the assumption that the conversion period t_U for performing Fourier transform is 0.05 seconds, if it is desired to examine frequency distribution patterns within T seconds because T seconds are sufficient time for a specific frequency distribution pattern to appear, the number of PoMDB vectors to be grouped into one DDT is set to 20 T (=T/0.05).

When the PoMDB vectors are continuously partitioned to consecutive DDTs by PoMDB vectors of 20 T as mentioned above, they are partitioned in a manner that most (about 70% or more) PoMDB vectors are overlapped between adjacent DDTs. For example, a new DDT is grouped to include, for example, PoMDB vectors of 15 T or 18 T that are already grouped into the previous DDT. In case of the example of 15 T, a DDT with 75% overlap is created each time, and in case of the example of 18 T, a DDT with 90% overlap is created each time. If PoMDB vectors are partitioned in such a manner that every DDT is overlapped as described above, PoMDB vectors newly included in each DDT become 5 T or 2 T, which means that a time window t_sW of T seconds is slid at intervals of 0.25 T or 0.1 T seconds so that a specific frequency distribution pattern is searched for within the time window t_sW.

If a DDT 500 is organized, the control unit 110 searches the DDT 500 to determine whether there is a locus of dominant MDBs matched with a distribution pattern of MDBs (hereinafter, called as 'specific pattern') that appears in case of each specific sound (S23). The specific sound may be a sound such as 'deceleration sound' and 'acceleration sound', generated at the time of deceleration or acceleration of an electric train, 'alarm sound' intermittently ringing just before the start or just after the stop, sound when a door is being opened or closed, and the like.

Figure 6:
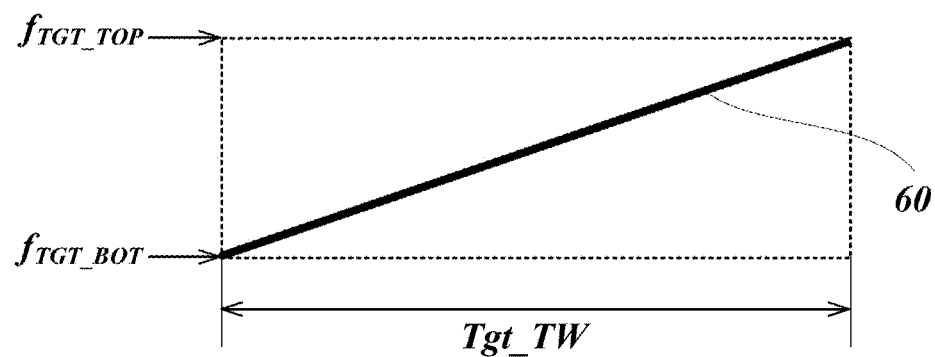
FIG. 6 exemplarily shows an intrinsic pattern that appears in the frequency distribution diagram in the case of a specific sound.

In a preferred embodiment of the present invention, it is checked whether or not there is a distribution locus of dominant MDBs matching with a specific pattern corresponding to 'deceleration sound', 'acceleration sound' (a specific pattern corresponding to 'deceleration sound' or 'acceleration sound' is called 'key pattern' in particular.), or 'alarm sound' in the DDT 500. More specifically, in case of an 'acceleration sound', it is checked whether there is, in the DDT 500, a distribution locus of dominant MDBs at least similar to an intrinsic pattern 60 that frequency components depicts in a series of MDBs in the form of a linearly increasing frequency across a particular band of $f_{TGT\_BOT}$~$f_{TGT\_TOP}$ during a predetermined time interval Tgt_TW, as illustrated in FIG. 6. The intrinsic pattern 60 is obtained under the same conditions, that is, the same conversion period and the MDBs of the same bandwidth as those for organizing the DDT, and the previously-confirmed intrinsic pattern is preset in the control unit 110.

The intrinsic pattern 60 illustrated in FIG. 6 is for a sound that sounds like "u-u-ung" when an electric train starts accelerating from a stationary state, and it shows a feature that frequency components increase across a bandwidth of approximately 1000 Hz. Therefore, if a subband is partitioned every 300 Hz (30 MDBs, each being 10 Hz, is grouped into a subband) as in the above example, a DDT probably reveals a pattern in which dominant MDBs are distributed in a linearly increasing manner over three or four subbands depending on the detection quality of an acceleration sound. In the case of the deceleration sound, contrary to the illustrated pattern of FIG. 6, its intrinsic pattern is linearly decreased in frequency.

Comparing the preset intrinsic pattern of the acceleration or deceleration sound with locus of dominant MDBs distributed on a target band $f_{TGT\_BOT}$~$f_{TGT\_TOP}$ while moving the preset intrinsic pattern along the target band on the DDT 500 being organized as above, the control unit 110 searches for a specific pattern matching about 70% or more with the preset intrinsic pattern as shown in FIG. 6. If such a specific pattern is found, the control unit 110 determines that there is an acceleration sound or a deceleration sound in the currently detected ambient sound.

In another embodiment of the present invention, instead of comparing the preset intrinsic pattern as illustrated in FIG. 6 with distribution locus of the dominant MDBs, after figuring out a unique characteristic of the intrinsic pattern beforehand, the DDT is searched to find a distribution of dominant MDBs having the unique characteristic. For example, assuming that the DDTs are constructed as described above for the surrounding sound to be detected, the control unit 110 may check whether there is a distribution locus of dominant MDBs in which a straight line with a constant slope k (k=rN/cN, rN=the number of dominant MDBs placed along the frequency axis, cN=the number of dominant MDBs placed along the time axis) is continued for about 3 seconds or more in the DDT 500 illustrated in FIG. 5 because the accelerating sound to be generated on acceleration of an electric train exhibits a distribution of dominant MDBs like a straight line having the slope k In the case of another specific sound, for example, an alarm sound or a sound generated when doors are being opened or closed, the above-explained detecting method can be applied to a specific pattern corresponding to that sound.

If a key pattern corresponding to an acceleration sound or a deceleration sound is detected in any one DDT among the consecutive DDTs partitioned in the manner as described above, the control unit 110 records information on the time (hereinafter, referred to as a "key detection time") at which the key pattern appears, and conducts an operation of determining a time point of entering a tunnel (that is, exiting the underground station) or exiting the tunnel (that is, entering the underground station), as follows, depending on whether the key pattern is for an 'acceleration sound' or a 'deceleration sound'.

The key detection time is figured out from the time information recorded in association with a PoMDB vector to which the leading or middle dominant MDB of a distribution locus of dominant MDBs determined to be the key pattern pertains.

If the key pattern detected in the DDT corresponds to the 'acceleration sound', the control unit 110 checks additional conditions. That is, it is checked whether or not an auxiliary signal for verification has been detected prior to detection of the key pattern (S24). The auxiliary signal for verification may be a notification sound that sounds like "dingdong dingdong dingdong" and is intermittently generated to notify passengers of the start of the electric train (or door close).

The detection of such a pre-departure alarm sound may be also conducted through the method of finding a distribution pattern of dominant MDBs corresponding to an intrinsic pattern for the pre-departure alarm sound in the DDT as in the above-described method for detecting a key pattern.

Figure 7:
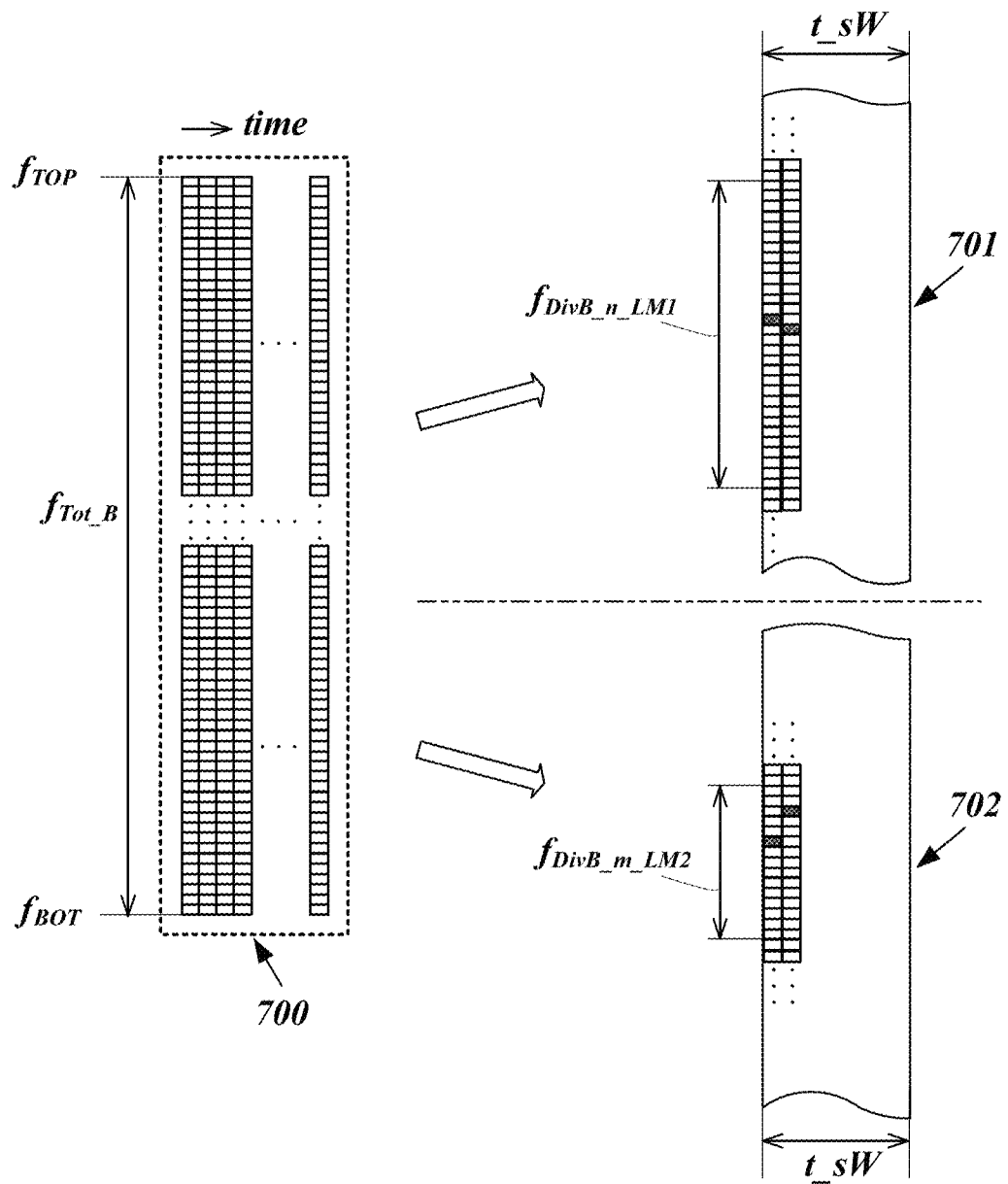
FIG. 7 schematically shows a process of performing detection of intrinsic patterns corresponding to specific sounds in parallel by conducting maximization by subband after applying bandwidth of a subband differently according to an embodiment of the present invention.

In another embodiment according to the present invention, a distribution pattern of dominant MDBs (hereinafter, referred to as 'auxiliary pattern') corresponding to an auxiliary signal for verification may be detected by applying LMP to each PoMDB vector differently from LMP to be applied to each PoMDB vector when detecting a key pattern. For example, in the two cases, the bandwidth of the subband to be divided from the search band for LMP may be different each other. FIG. 7 schematically shows a process of performing the operation detecting the key pattern and the auxiliary pattern simultaneously by applying the mutually different bandwidths $f_{DivB\_n\_LM1}$ and $f_{DivB\_m\_LM2}$ of a subband.

As described above, the control unit 110 sets the subband widths (namely, the number of MDBs to be grouped for LMP) to be different from each other for each of PoMDB vectors 700 provided from the frequency analyzing unit 113, and marks a dominant MDB in each subband to create a plurality of DDTs 701 and 702. In the assumption that the search band is divided into MDBs of 10 Hz bandwidth, if the number of MDBs to be grouped (namely, to become a single subband) for detecting a key pattern is 30 as in the above example, 15 MDBs may be grouped into one subband $f_{DivB\_m\_LM2}$ in order to detect an auxiliary pattern.

The reason why the bandwidth of a subband to be divided from the search band is set to be narrowed in detection of an auxiliary pattern, as described before, is because the sound corresponding to an auxiliary pattern has a bandwidth narrower than that of the sound corresponding to a key pattern. Since a sound such as pre-departure alarm sound actually has a bandwidth of 20 to 30 Hz, if the search band is divided into subbands of bandwidth larger than the 150 Hz (i.e., 15 MDBs) given as an example above, the frequency component of the alarm sound may not be identified as the maximum value due to other sounds that probably occur within the bandwidth of a corresponding subband, so that the possibility of the auxiliary pattern detection failure increases.

On the other hand, in the case of the accelerating sound of about 1000 Hz bandwidth corresponding to the key pattern, a partitioned subband for key pattern detection is set to have bandwidth within the range of 200 Hz to 400 Hz (preferably, bandwidth of 300 Hz as mentioned as an example above), which is narrower than the bandwidth of the acceleration sound, and then the LMP is applied to each partitioned subband. The reason for this is also that if the search band is partitioned into subbands by a larger bandwidth, the frequency component of a sound corresponding to the key pattern may not be identified as the maximum value in the LMP due to other sounds that probably occur in each partitioned subband, so that the error probability of key pattern detection increases.

Setting a subband to be smaller than the above example, the sound corresponding to the specific pattern can be always marked as a dominant MDB in a corresponding subband, but other subbands adjacent thereto may have an MDB marked as dominant due to unwanted sounds generated in each of those adjacent subbands. This negatively affects the detection of the specific pattern. Therefore, narrowing the subband is not always advantageous for the detection of the specific pattern. It is preferable in detecting the specific pattern to divide a search band into subbands by the bandwidth of the above-exemplified numerical value or the numerical value close thereto and conduct LMP with the divided subbands.

As illustrated in FIG. 7, after a plurality of DDTs 701 and 702 are created based on subbands with mutually different bandwidths, the control unit 110 searches one DDT 701 for the key pattern and searches the other DDT 702 for the auxiliary pattern, in parallel.

If the auxiliary pattern corresponding to an auxiliary signal such as the 'pre-departure alarm sound' is detected from the DDT, the control unit 110 sets a variable to a value indicating that the auxiliary pattern is detected.

Therefore, in the case that the key pattern corresponding to the 'acceleration sound' is detected in the DDT as explained above (S23), the control unit 110 immediately checks a value of the variable indicating whether the auxiliary pattern is detected or not, and determines a time interval, depending on the value of the variable, to be applied to select a measured value that is obtained at entering a tunnel (namely, at exiting platform) in the measurement table 300 structured as illustrated in FIG. 3 for recording the measured intensities of electromagnetic wave. This will be described in more detail below.

If the variable is set to a detection indicating value, the control unit 110 resets the variable and determines a time, which is obtained by adding the preset recommended time to the key detection time recorded previously, as the tunnel entering time (S25-1), otherwise, it determines the tunnel entering time by adding the predetermined time limit to the key detection time (S25-2). The time limit may be set to be longer by about 3 to 6 seconds than the recommended time depending on what kind of sound corresponds to the auxiliary pattern, and the recommended time is preferably set in the range of 8 to 16 seconds.

The recommended time is determined based on measurements of a time interval required from acceleration start of an electric train to passing the reference point (for example, 3 or 5 meters from the end of a platform) defined as the boundary between an underground station and a tunnel. And it can be finely adjusted depending on the order of a carriage, which the measuring apparatus 100 is placed and operated on, among several carriages pertaining to the electric train. As described above, in the case that the measuring apparatus 100 is placed and operated in a carriage of a certain order different from the recommended order of carriage, the recommended time may be adjusted within a range of about one second. For example, in the assumption that the recommended time is set on the basis of the placement on a leading carriage, if the measuring apparatus 100 is placed and operated in the last (for example, the eighth) carriage of the electric train, an operator inputs such boarding order information to the control unit 110 via the interface unit 115, and accordingly, the recommended time may be set longer than the initially set value by about 1 second.

After the tunnel entering time is determined as described above, the control unit 110 finds, in the measurement table 300 stored in the storage unit 116, an entry in which the measured time 311 closest to the determined tunnel entering time is recorded, and additionally records, for the found entry, an indicator 312 for identifying the entry as a 'start point to enter tunnel' (S26).

If the key pattern detected from the DDT corresponds to the 'deceleration sound', the control unit 110 confirms additional condition. That is, it checks whether an auxiliary pattern corresponding to an auxiliary signal for verification is detected within a predetermined time limit from the key pattern detection time (S24) in the same manner as explained above. The auxiliary signal for verification may be an alarm sound that intermittently sounds to notify the stop of an electric train (or the opening of doors), and it may be the same as the 'pre-departure alarm sound' of an electric train.

If the auxiliary pattern is detected within the predetermined time limit, that is, if the additional condition is satisfied, the control unit 110 determines a time, which is obtained by adding the predetermined recommended time to the previously recorded key detection time, as the tunnel exiting time (that is, platform entering time) (S25-1). If the detection of the auxiliary pattern within the time limit fails, the control unit 110 determines another time, which is obtained by adding the predetermined time limit to the key detection time, as the tunnel exiting time (S25-2). The recommended time and the time limit applied to determine the tunnel exiting time may be set to the same values as the recommended time and the time limit, respectively, which are applied to determine the tunnel entering time mentioned above. To be sure, the recommended time and the time limit to be applied to determination of tunnel entering time and tunnel exiting time, respectively, may be set differently for the cases of tunnel entering and existing, depending on the characteristics of the deceleration/acceleration of an electric train or what type of an auxiliary sound signal is adopted for verification.

After determining the tunnel exiting time, the control unit 110 finds, in the measurement table 300 which the measured intensities of electromagnetic wave are continuously recorded in, an entry in which the measured time 311 closest to the determined tunnel exiting time is written, and additionally records, for the found entry, an indicator 312 for identifying the entry as a 'start point to exit tunnel' (S26).

Figure 8:
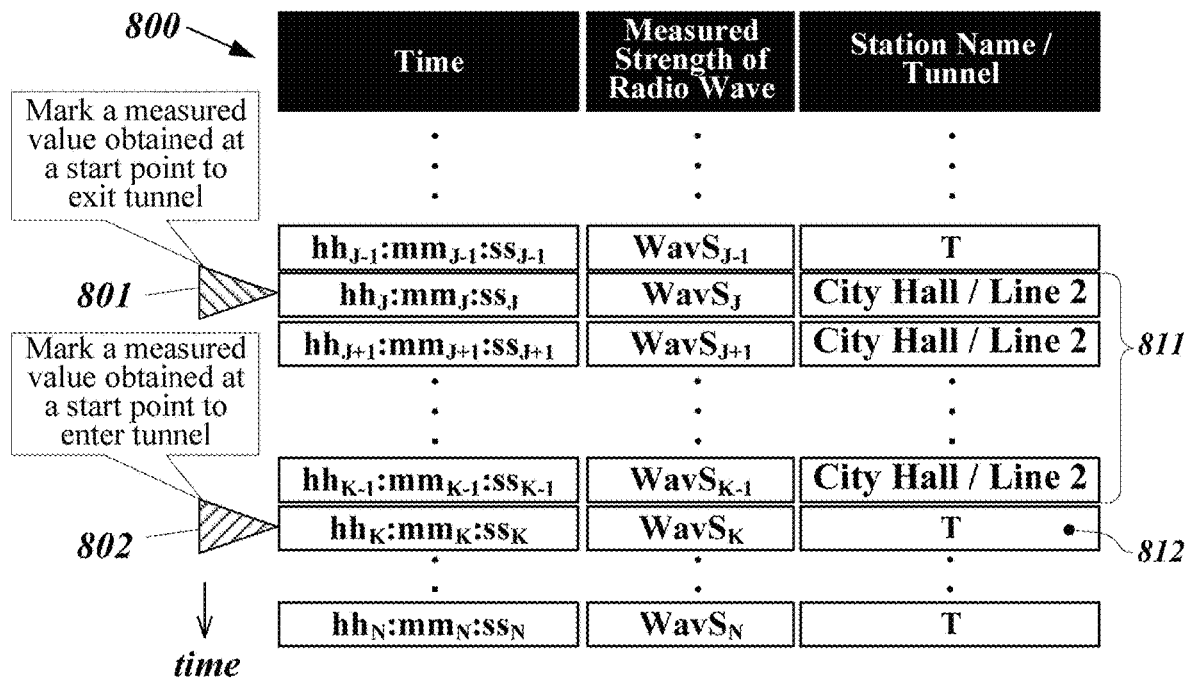
FIG. 8 shows an example of a measurement table in which electromagnetic wave intensities being measured are recorded together with information indicative of a boundary position between the underground station and the tunnel section and the identified station name according to another embodiment of the present invention.

In an embodiment according to the present invention, the control unit 110 adds information, for example, the name or number of a subway station, for identifying an underground station where measurement is done, with respect to the measured values between an entry corresponding to the start point to exit tunnel, that is, the start point to enter platform and another entry corresponding to the start point to enter tunnel, that is, the start point to exit platform, which are determined in the manner as explained before. FIG. 8 illustrates an exemplary measurement table 800 constituted by recording the measured intensities of electromagnetic wave according to the present embodiment.

In the embodiment to constitute the measurement table as illustrated in FIG. 8, the control unit 110 identifies an underground station, and writes a station name, and/or number etc. (called as 'station identification code' (SIC) hereinafter) allocated to the identified underground station in additional information field 811, with respect to entries from the entry 801 determined to the start position to exit tunnel to an entry right before the entry 802 determined to the start position to enter tunnel.

In the present embodiment, the SIC is acquired through the WiFi modem 114. After the WiFi modem 114 is activated, the WiFi modem 114 periodically searches each channel of the WiFi signal band and if a valid signal is detected, it demodulates the detected valid signal to extract beacon frames and obtains information on an Access Point (AP) from each field of the frame. The information thus obtained includes a Service Set Identifier (SSID) and a Basic Service Set Identifier (BSSID). In the case of an AP, the BSSID is a MAC (Medium Access Control) address of the wireless LAN module (hereinafter, referred to as 'AP identification address'), which uniquely identifies a communication device. When the WiFi modem 114 detects the AP Identification Address (APIA) from the WiFi signal band, it delivers the APIA to the control unit 110.

The WiFi modem 114 may not perform an access procedure for allocating an IP address from an AP even when the AP is found, unless there is a special request from the control unit 110.

In one embodiment of the present invention, the WiFi modem 114 does not provide the control unit 110 with the APIA for an AP if the APIA is continuously detected for a predetermined time (for example, five minutes) or more. The continuously detected AP may be an AP, installed in an electric train, moving with the measuring apparatus 100 placed in the electric train or an AP built by a hot spot function of a portable communication device carried by a person on board the electric train. Because these APs have nothing to do with identifying an underground station where an electric trains stops, the WiFi modem 114 does not provide the information of any AP detected like that for the control unit 110.

If an arbitrary APIA is received from the WiFi modem 114, the control unit 110 searches an AP installation table of stations, stored in the storage unit 116, for the received APIA. The AP installation table of stations is a database built by linking the identification address of each AP installed in each platform of the subway with SIC uniquely identifying an underground station in which the corresponding AP is installed.

If there is an address identical to the received APIA in the AP installation table of stations, the control unit 110 reads a SIC recorded in association with the APIA, and writes the SIC in each of the fields 811 prepared for station identification, as illustrated in FIG. 8, with respect to entries of the measurement table 800 that are determined to have been recorded from measurement within section of a platform.

On the other hand, as described above, the control unit 110 writes specific information 812, which indicates that the measured values are measured in the section of a tunnel, in the fields for station identification, with respect to the entries (that is, the entries including values measured within a tunnel section) placed between entries in which SICs are recorded respectively as explained before.

Figure 9:
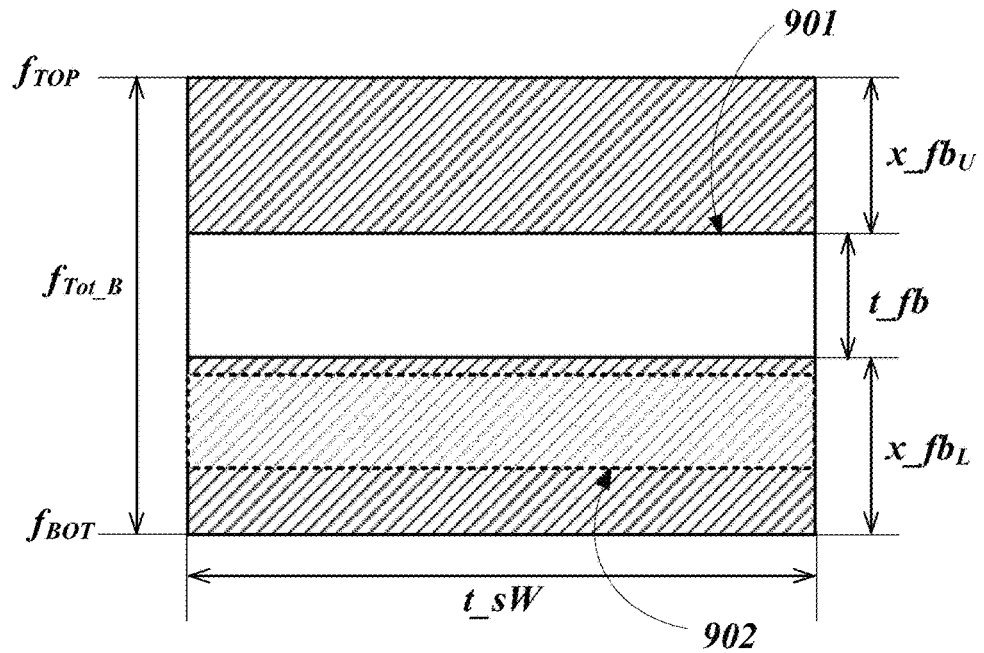
FIG. 9 is a diagram illustrating a case where a target band to be searched for detection of a specific pattern corresponding to a specific sound is narrower than a band of the converted frequency spectrum and is set differently depending on a pattern to detect, according to an embodiment of the present invention.

In an embodiment according to the present invention, when creating a DDT after the LMP for PoMDB vectors, the control unit 110 may create it by limiting to a part of the search band (e.g., the entire audible band). FIG. 9 is a drawing showing an example thereof.

In the present embodiment, the control unit 110 excludes MDBs belonging to the upper and lower bands $x\_fb_L$ and $x\_fb_U$ except a target band $t\_fb$ for pattern search, that is, the band which a specific pattern to be detected appears in, from PoMDB vectors obtained for the search band $f_{Tot\_B}$, and creates a DDT 901 by applying the LMP to the MDBs, remained after the exclusion, pertaining to the target band $t\_fb$. Afterwards, the DDT 901 thus created is searched for a distribution locus of dominant MDBs matched with a specific pattern to be detected in the target band $t\_fb$.

In the present embodiment: the target bands are set differently depending on specific patterns to be detected; the DDTs are created respectively for the target bands that are not equal to each other; the LMP is conducted for each of the target bands; and the distribution patterns of MDBs that seem to match the key and auxiliary patterns respectively are searched for in the respective DDTs 901 and 902.

If the DDT is reduced in this way for detection of a desired specific pattern, the time required for LMP, etc. can be greatly shortened. Therefore, according to the present embodiment, frequency conversion for the sliding time window $t\_sW$ and checking whether sound corresponding to the specific pattern is present or absent in the time window can be conducted in almost real time.

Figure 10:
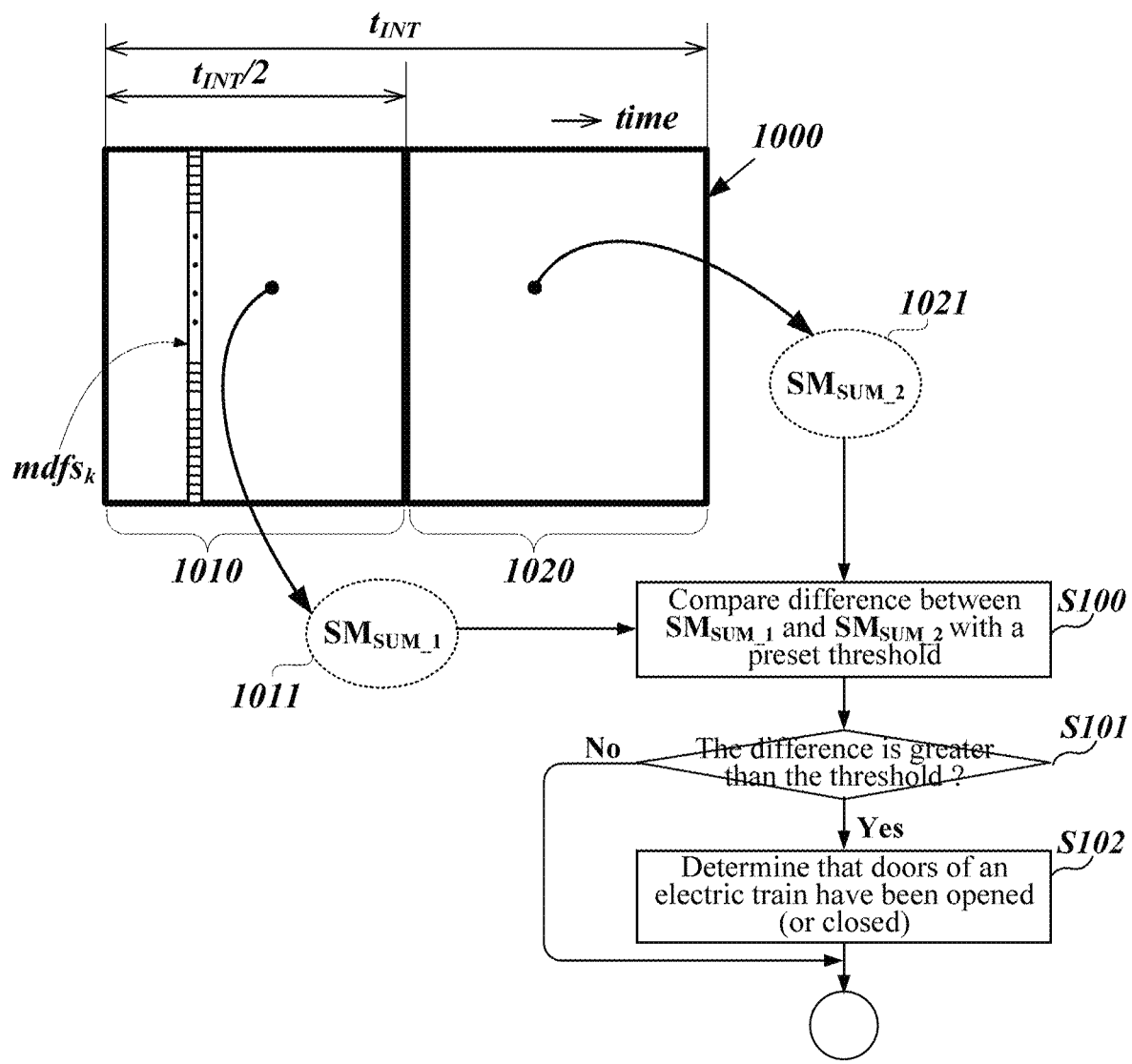
FIG. 10 is a diagram schematically illustrating a process for detecting whether a specific sound is generated according to another embodiment of the present invention.

In the above-described embodiment, the auxiliary signal for verification is also detected from the DDT in the same manner as in the key pattern detection method. However, in another embodiment according to the present invention, whether or not an auxiliary signal for verification occurs can be determined without using the DDT. In this embodiment, the auxiliary signal for verification may be a sound (or noise), other than a pre-departure alarm sound or an alarm sound after stop, to be heard, for example, when doors are opened and/or closed. Hereinafter, a method of detecting such auxiliary signal for verification according to this embodiment will be described in detail with reference to FIG. 10.

Even in the present embodiment in which a sound heard at the opening and closing of doors of an electric train, in particular, the change of the sound, is used as the auxiliary signal for verification, the above-described method based on the DDT is still applied to the key pattern.

From the viewpoint of the interior of an electric train, when doors are opened, generally a loud sound (i.e., noise) is suddenly heard from the surroundings, and on the other hand, when doors are closed, the sound suddenly decreases remarkably. In addition, the surrounding sound suddenly heard at the time of door opening has a characteristic that it is not concentrated in a specific frequency band.

Accordingly, in order to detect such a change in sound, while sequentially arranging the PoMDB vectors $mdf_{sk}$ transmitted from the frequency analyzing unit 113 in the order of their transmission, the control unit 110 organizes one Power Distribution Map (PDM) 1000 by separating some PoMDB vectors from those that are subsequently received when the number of said some PoMDB vectors is corresponding to a certain time interval $t_{INT}$ (this time interval may be the same interval as the above-described sliding time window $t\_sW$).

If one PDM 1000 is organized as described above, the control unit 110 divides the PDM temporally into a first half 1010 and a second one 1020, and obtains the total power for each half. That is, it obtains summed values 1011 and 1021 of PoMDB vectors pertaining to each of the first half 1010 and the second half 1020. Then, the control unit 110 compares the difference between the summed values 1011 and 1021 with a preset threshold (S100), and determines that a signal at the time of door opening (or closing) of the electric train is detected (S102) if the difference is larger than the preset threshold (S101).

The decision on whether the sound change is caused from the door closing or the door opening is based on which part of both halves is greater in the total power. That is, it is determined that the door is closed if the total power of the first half 1010 is greater, and it is determined that the door is opened if the total power of the second half 1020 is greater.

In another embodiment according to the present invention, when the change of the sound due to the door opening/closing is used as an auxiliary signal for verification, the control unit 110 does not perform the above-explained operations of: obtaining the total power in frequency domain; and checking whether or not the total power is changed beyond a certain level. Instead, the control unit 110 detects change of the power immediately in the time domain. For the present embodiment, the frequency analyzing unit 113 obtains a signal strength value, every conversion period $t\_U$, by summing (or averaging) magnitudes of the signals sampled during the period $t\_U$, and provides the obtained signal strength value for the control unit 110.

The control unit 110 constitutes a signal strength block by collecting a series of signal strength values provided sequentially until they are corresponding to the predetermined time interval ($t_{INT}$). Then, it detects the change of the sound, namely, the door opening/closing based on the difference in the total signal strength (sum of the signal strength values of a corresponding half) between the first half and the second half of the constituted signal strength block. That is, as explained above, if the total signal strength of the first half is greater than that of the second half by more than a predetermined threshold, the control unit 110 determines that the auxiliary signal for verification, namely, the sound change due to the door closing is detected. On the contrary, if the total signal strength of the first half is smaller than the that of the second half by more than a predetermined threshold, it determines that the auxiliary signal for verification, namely, the sound change due to the door opening is detected.

The operation of measuring the electromagnetic wave on board an electric train as distinguishing between the underground station of the subway and the tunnel using sounds generated from the surroundings is carried on continuously until the electromagnetic wave measurement is terminated (S27). The termination of the measurement may be when an operator commands the measuring apparatus 100 to stop the measurement via the interface unit 115.

Figure 11:
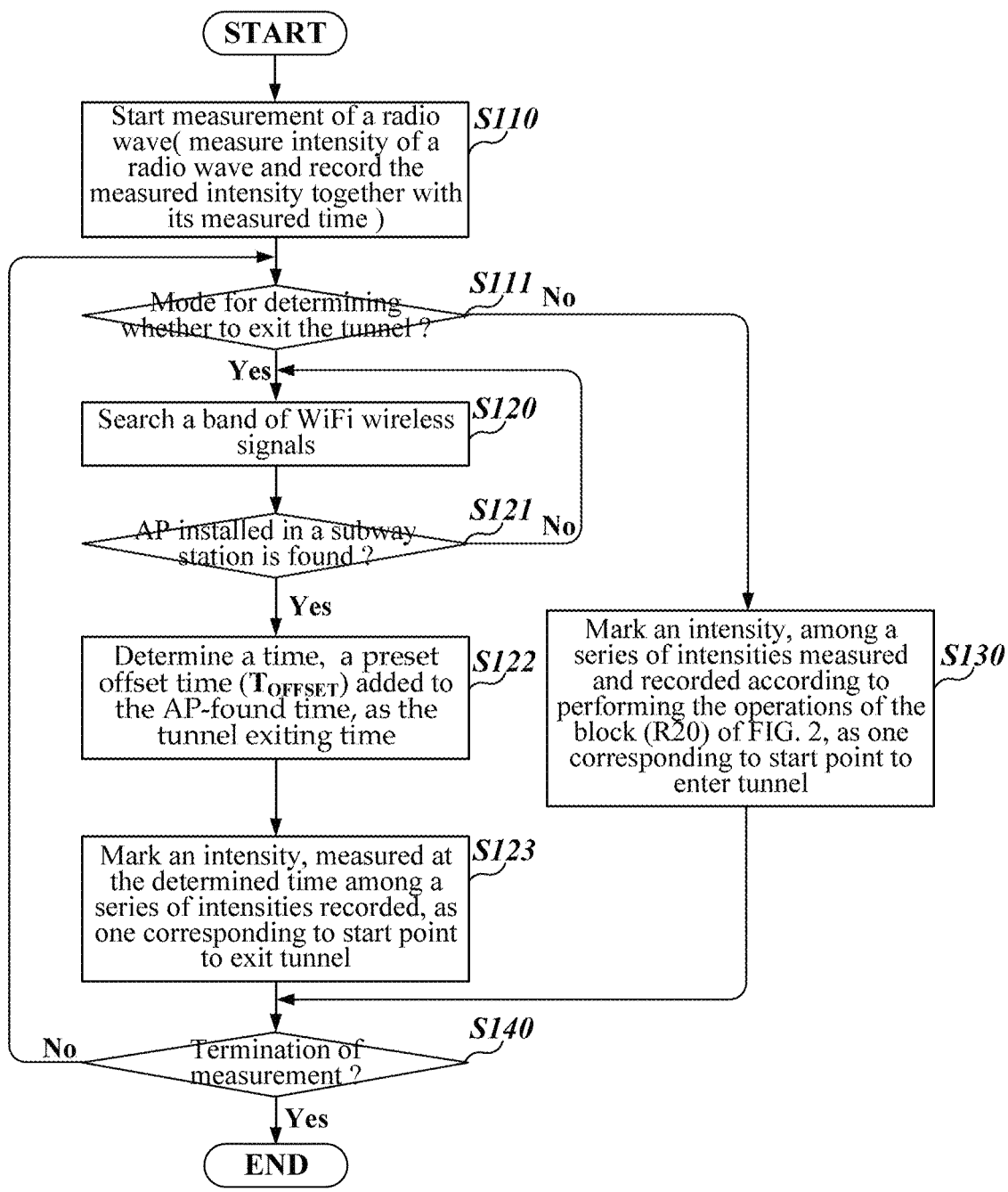
FIG. 11 is a flowchart illustrating a method of measuring the intensity of a radio wave on a subway route as distinguishing between an underground station and a tunnel section according to another embodiment of the present invention.

In all the embodiments of the present invention described hereinbefore, the sounds generated in the surroundings are used as a basis for distinguishment of both the start point to enter tunnel and the start point to exit tunnel of an electric train. However, in another embodiment according to the present invention, the tunnel exiting, namely, the platform entering may be determined in a different manner without using sounds. FIG. 11 is a flowchart of a method for measuring the intensity of a radio wave along a service route of subway as distinguishing between an underground station and a tunnel according to the present embodiment.

In the embodiment according to FIG. 11, after the start of the electromagnetic wave measuring operation (S110), a distinguishment method is applied differently depending on whether the current state is to determine tunnel entering or tunnel exiting. If the current state is a mode for determining tunnel entering, that is, not a mode for determining tunnel exiting (S111), the control unit 110 conducts the same operation, described with reference to FIG. 2, of identifying the start point to enter tunnel, in a series of electromagnetic intensities being currently measured and recorded, based on whether a key pattern corresponding to an acceleration sound is detected or not (S130). However, if a mode for determining tunnel exiting (that is, platform entering) (S111), the control unit 110 uses the WiFi network signal from the APs installed for each underground station.

In this embodiment, the WiFi modem 114 searches for a WiFi signal band every a period of 0.5 seconds or less (S120). If one or more available APs are found, it creates a list of the APIA (i.e., BSSID) of each of the found APs and transmits the list to the control unit 110. Then, the control unit 110 searches the AP installation table of stations, which are configured by registering the APIAs of APs installed in each platform in the order of APIAs, stored in the storage unit 116 for each APIA included in the received list.

If at least one APIA in the list is found in the AP installation table of stations (S121), the control unit 110 determines the tunnel exiting time (that is, the platform entering time) by adding a predetermined offset time to a time when the corresponding AP is discovered in WiFi band searching, that is, when the list including the APIA found in the AP installation table of stations is received from the WiFi modem 114. The offset time is a time within about 5 seconds, which is considerably shorter than the recommended time to be applied to key pattern detection as described above, and it may have a negative value as well as a positive value. Having a positive value means that the point of time after an AP at the platform is discovered is determined as the tunnel exiting time, and having a negative value means that the point of time before an AP at the platform is discovered is determined as the tunnel exiting time. The former case can be applied to a situation in which the APs of a platform can be detected before a carriage in which the measuring apparatus 100 is placed passes the reference point defined as the boundary between an underground station and a tunnel. Depending on the location of an AP providing WiFi network on a platform, the wireless signal of the AP may propagate to some extent into a tunnel. In this situation, the position where the AP on the platform starts to be detected may be further inside a tunnel than the reference point defined the boundary between a platform and a tunnel.

The offset time may be determined based on statistics obtained through tests for many underground stations. Alternatively, the offset time may be applied differently to each subway station, taking into account the AP installation situation in each platform. To this end, the storage unit 116 is provided with an 'offset time allocation table' to be applied to each underground station. Then, after identifying the SIC, which identifies a platform uniquely, based on the APIA detected from the radio signal propagated by the AP installed on the platform, as in the above-described embodiment, the control unit 110 finds the identified SIC in the offset time allocation table, and applies an offset time recorded in association with the found SIC to the determination of the tunnel exiting time for the corresponding underground station.

In the above-explained embodiments, the auxiliary signal for verification is detected from the sound generated in the surroundings. However, in other embodiments according to the present invention, the auxiliary signal for verification may be detected based on other factors. Hereinafter, these embodiments will be described in detail.

In the first embodiment, a signal corresponding to a change in motion of the measuring apparatus is used as the auxiliary signal for verification. For this purpose, the measuring apparatus 100 is additionally equipped with a separate sensor capable of detecting motion, for example, an acceleration sensor. The acceleration sensor is electrically connected to the control unit 110 in such a manner that a signal corresponding to a change in movement of the measuring apparatus 100, that is, an acceleration acting thereon, is applied to the control unit 110.

While the measuring apparatus 100 equipped with the acceleration sensor is placed on the running electric train, a force due to the acceleration or deceleration acts on the measuring apparatus 100 as it is when the electric train is accelerated at the start from stop or is decelerated for stopping. Thus, the acceleration sensor detects the magnitude of the acceleration or deceleration when the force acts like that.

Accordingly, when the key pattern corresponding to the acceleration sound or the deceleration sound is detected in the DDT, the control unit 110 determines that an auxiliary signal for verification is detected if it is confirmed that a signal equal to or greater than a predetermined level is continuously applied from the acceleration sensor for a predetermined time (for example, 3 seconds) or more. Afterwards, it determines a tunnel entering time or a tunnel exiting time with the recommended time to be applied when detecting the corresponding key pattern. That is, the tunnel entering time or the tunnel exiting time is determined by adding the recommended time to the time when the key pattern is detected.

Figure 12:
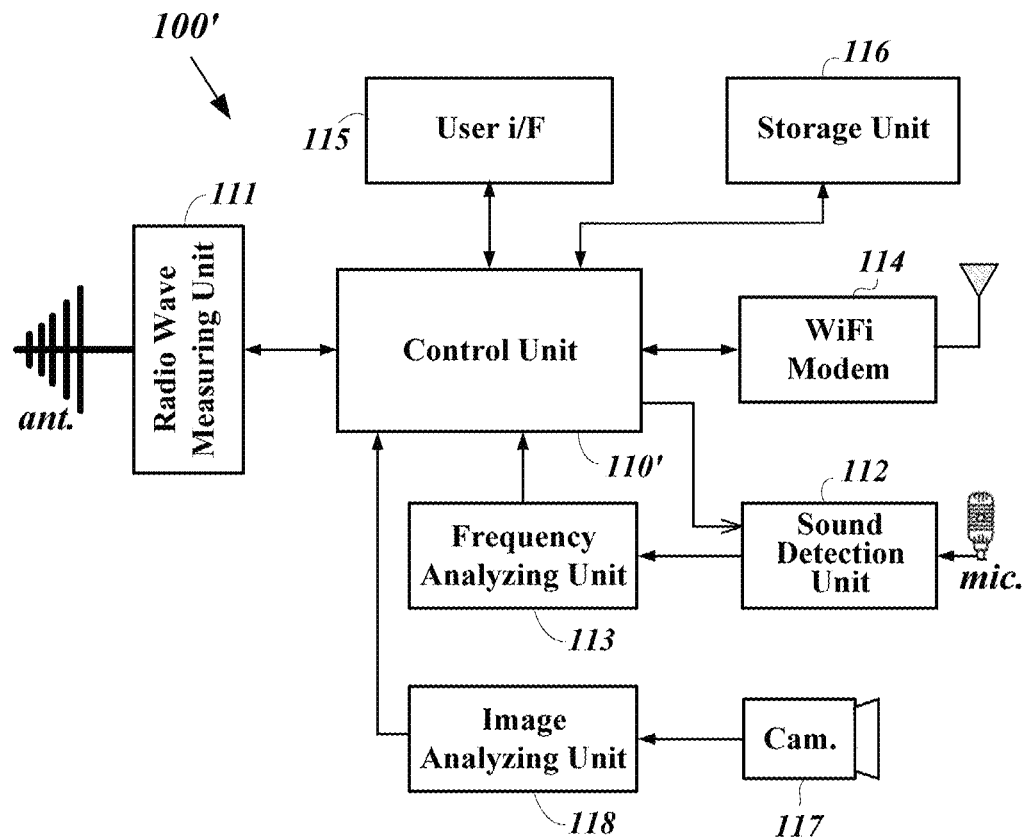
FIG. 12 illustrates a block diagram of an apparatus for measuring the intensity of a radio wave on a subway route while distinguishing between an underground station and a tunnel section according to another embodiment of the present invention.

In the second embodiment, another auxiliary signal for verification is detected from images being captured from scenes which are viewed outside windows of a running electric train. The measuring apparatus according to the present embodiment can be configured as illustrated in FIG. 12. As shown in this figure, a photographing unit 117 such as a camera and an image analyzing unit 118 are additionally equipped in the measuring apparatus as compared with the configuration of the measuring apparatus illustrated in FIG. 1. Other components illustrated in FIG. 12 conduct the same functions respectively as those of the same reference numeral in FIG. 1.

In the electromagnetic wave measurement, the photographing unit 117 is attached or fixed in such a manner as to take pictures the outside through windows of an electric train. The photographing unit 117 fixed or attached like that continues to capture the outside views of a running electric train. The image analyzing unit 118 compares the frames of the pictures being captured to obtain a motion vector of an entire frame (hereinafter, referred to as a 'frame motion vector') and transmits the frame motion vectors obtained sequentially to the control unit 110'.

The method of obtaining the frame motion vector is to calculate how much the same object, namely, the block of pixels, is moved in a region while setting the region differently in the frames being captured according to brightness of the corresponding images. In other words, the pixel distance (corresponding to the magnitude of a frame motion vector) that the pixel block is moved in the frame is obtained. For example, when the brightness of a captured image is higher than a certain level, the upper region of the image is set to a block from which the frame motion vector, and when the brightness is lower than the certain level, the middle or lower region of the image is set. The reason for changing the region on the frames is to prevent errors in detection of frame motion vectors due to images of some moving or running passengers by excluding passengers who would be photographed in the case of a platform, and to calculate the frame motion vector without errors by detecting the movement of bright pixels in a region where lightings illuminating the railway tracks in the dark tunnel is photographed in the case of a tunnel.

Figure 13:
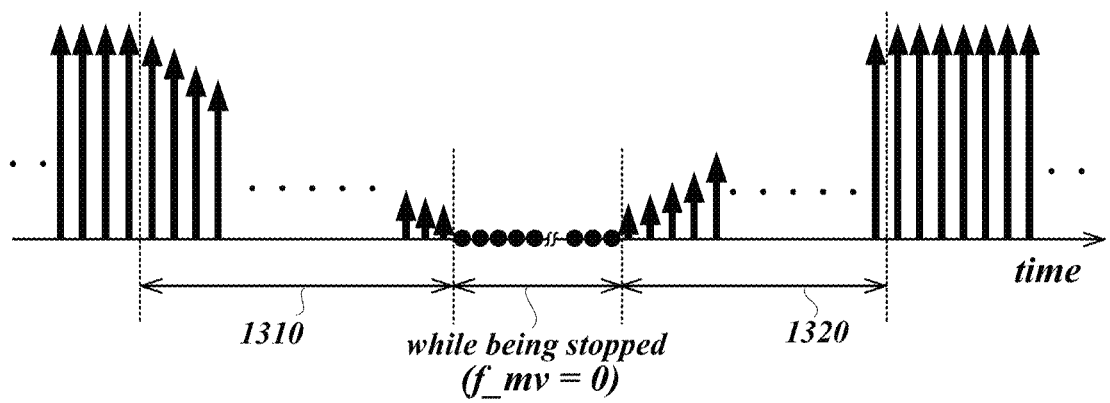
FIG. 13 is a diagram exemplarily showing a change in the magnitude of a motion vector when a frame motion vector is obtained with respect to an image captured from outside the window of a running electric train.

The measuring apparatus 100' having the configuration illustrated in FIG. 12 according to the present invention determines whether an electric train is moving, stopped, accelerating or decelerating from images being captured from scenes outside windows of an electric train. To this end, the control unit 110' keeps monitoring the magnitude of the frame motion vectors that are continuously provided by the image analyzing unit 118 as illustrated in FIG. 13, in order to check whether there is a section where magnitudes of the frame motion vectors are steadily decreasing (1310) or increasing (1320) for a certain period of time, for example, 3 seconds or more. If there is such a magnitude decreasing interval 1310 or a magnitude increasing interval 1320, the control unit 110' determines that the additional condition is satisfied, namely, detection of the auxiliary signal for verification is made, and accordingly determines the tunnel exiting time or the tunnel entering time with the recommended time to be applied when detecting a corresponding key pattern as in the above-explained embodiments. That is, the tunnel exiting time or the tunnel entering time is determined by adding the recommended time to the key detection time.

Even in this embodiment, if the decreasing section 1310 or the increasing section 1320 is not detected before or after the detection of the key pattern, the control unit 110' determines the tunnel exiting time or the tunnel entering time by adding a time limit longer than the recommended time to the key detection time, as explained hereinbefore.

In the above-described embodiment in which the auxiliary signal for verification is detected from the images captured from scenes outside the window of an electric train, the SIC may be also figured out from the captured images without using an WiFi signal. That is, the image analyzing unit 118 applies an Optical Character Reading (OCR) algorithm to the images being photographed by the photographing unit 117 so as to recognize a station name (or a station number) written on the wall of a platform as character or numerical information.

In one embodiment of the present invention, in order to reduce the failure or error in the character recognition, when the frame motion vectors obtained from the images are held at 0 in magnitude for a predetermined time (for example, one second) or longer, or when the brightness of the images being captured is equal to or higher than a predetermined level while the magnitude is kept at 0 for a predetermined time or more, the image analyzing unit 118 applies the character recognition algorithm to those images being captured.

The control unit 110' records a station name and the like recognized from the images as the SIC in the entries of the electromagnetic wave intensities measured for the section of a platform as in the above-described embodiment.

As for the measurement information, which are obtained from measuring as distinguishing between a platform and a tunnel, of the measurement table 300 or 800 stored in the storage unit 116 as shown in FIG. 3 or 8, the control units 110 and 110' of the measuring apparatuses 100 and 100', the electromagnetic wave measuring operations of which are described in detail so far, may adapt the measurement information to an output form of a proper format and then output it to the interface unit 115 or transmit it to a desired device through the WiFi modem 114 when an operator commands its output via the interface unit 115. Needless to say, in the case that the measuring apparatuses 100 and 100' are equipped with an interface for connection with an external device, they may transmit the measurement information as a single file to a storage device connected via the interface.

Unless the various embodiments, for the method of measuring the intensity of electromagnetic waves along a service route of subway as distinguishing between an underground station and a tunnel, described so far are not compatible with each other, the explained embodiments can be properly chosen in various ways and then combined to achieve the concept and idea of the method.

So far, the technical principles and concept of the present invention have been described in detail by citing the WiFi network of a high-speed wireless LAN as an example of a data communication network. However, the technical principles and concept of some embodiments of the present invention can be embodied with wireless signals from an wireless network other than the WiFi network if the wireless network is limited in service area and locally distributed as well. Therefore, it should be understood that the scope defined by appended claims cannot be excluded only on the ground that a wireless network installed in each platform is different from the Wi-Fi network presented as an example in the present specification.

The embodiments of the present invention described above have been introduced for the purpose of illustration; therefore, it should be understood by those skilled in the art that modification, change, substitution, or addition to the embodiments is possible without departing from the technical principles and scope of the present invention defined by the appended claims.

What is claimed is:

1. An apparatus for detecting surrounding sounds while moving with a moving object,
   a sound analyzing unit configured to obtain, every predetermined interval, frequency distribution information of a sound for the predetermined interval, the sound being generated around the apparatus; and
   a control unit configured to determine the moving object to be in a particular movement state corresponding to one of specific sounds generated in surroundings through determination, based on the obtained frequency distribution information, of whether or not said one of the specific sounds is generated, each of the specific sounds being a predetermined sound from which a movement state of the moving object is identifiable, wherein the control unit is further configured
to search each of subbands divided from a target band, with respect to the frequency distribution information that the sound analyzing unit obtains periodically, to find a unit band corresponding to a maximum frequency component among unit bands, each with a designated bandwidth, pertaining to said each subband, and to mark the found unit band as a Dominant Unit Band (DUB),
to check a distribution locus of DUBs on a DUB distribution table organized by collecting a plural pieces of the frequency distribution information as much as a predetermined time, in order to confirm whether the distribution locus matches with any one of intrinsic patterns preset respectively for the specific sounds, each of said plural pieces of the frequency distribution information, in the DUB distribution table, consisting of the subbands, each containing the marked DUB, and
to determine that said one of the specific sounds has been generated, if it is confirmed that the distribution locus of DUBs matches with one intrinsic pattern preset for said one specific sound.

2. The apparatus of claim 1, further comprising a storage unit configured to store measured information, wherein the control unit is further configured
to receive measured intensity of radio wave and to store the measured intensity in the storage unit together with information on measurement time, and
in case of confirmation that the distribution locus of DUBs on the DUB distribution table matches with said one intrinsic pattern, to determine a time point later by a designated time interval, based on a time at which the matching distribution locus appears, as a boundary time point, and to record information for causing a radio wave intensity, which has the information on measurement time closest to the determined boundary time point among measured intensities stored in the storage unit, to be identified as an intensity measured at a start position of a platform or a tunnel section, and
wherein the moving object is an electric train.

3. The apparatus of claim 2, wherein the control unit is configured to record information for causing a radio wave intensity, which has the information on measurement time closest to the determined boundary time point, to be identified as an intensity measured at a start position of a tunnel section, in case a distribution locus of DUBs matching with a first intrinsic pattern preset for a sound to be generated when an electric train accelerates is detected from any one of DUB distribution tables being organized, or as an intensity measured at a start position of a platform, in case a distribution locus of DUBs matching with a second intrinsic pattern preset for a sound to be generated when an electric train decelerates is detected.

4. The apparatus of claim 3, wherein the control unit is configured to determine the boundary time point by applying length of the time interval differently depending on an additional condition of whether a specific signal caused from a sound to be generated in an electric train just prior to start has been detected or not before detection of a distribution locus of DUBs matching with the first intrinsic pattern, in case the distribution locus matching with the first intrinsic pattern is detected from said any one of the DUB distribution tables, or depending on an additional condition of whether a specific signal caused from a sound to be generated in an electric train just after stop is detected or not within a specified time after detection of a distribution locus of DUBs matching with the second intrinsic pattern, in case the distribution locus matching with the second intrinsic pattern is detected from said any one of the DUB distribution tables.

5. The apparatus of claim 4, wherein the specific signal is a specific sound that is generated to notify passengers that an electric train is going to start or has stopped, and
the control unit is configured to judge detection of the specific sound based on whether a distribution locus of DUBs matching with a third intrinsic pattern preset for the specific sound is detected from the DUB distribution tables being organized.

6. The apparatus of claim 4, wherein the specific signal is a change in magnitude of a sound heard inside a carriage of an electric train when its doors are opened or closed, and
the control unit is configured to determine that the specific signal is detected when a surrounding sound detected by the sound analyzing unit changes more than a threshold value within a predetermined period of time.

7. The apparatus of claim 3, wherein the control unit is configured to record station identification information that uniquely identifies a subway station corresponding to a platform with respect to measured intensities from a measured radio wave intensity, which information indicative of measurement at a start point of the platform is recorded in relation with, to another measured radio wave right adjacent to a measured intensity which information indicative of measurement at a start point of a tunnel section is recorded in relation with.

8. The apparatus of claim 7, further comprising a communication unit configured to be capable of communicating with an Access Point (AP) providing a wireless communication network locally within a limited area according to a specific signaling method, wherein the control unit is configured to obtain the station identification information for the corresponding platform through searching a list of APs, which have been installed in platforms of subway stations, for an identifier of a certain AP provided by the communication unit.

9. The apparatus of claim 2, further comprising a communication unit configured to be capable of communicating with an AP providing a wireless communication network locally within a limited area according a specific signaling method, wherein the control unit is configured:
to check whether or not an arbitrary AP of which identification information is provided from the communication unit is an AP installed in a platform of a subway station;
if it is confirmed that the arbitrary AP is installed in a platform, to determine a time point, which is a designated offset time apart from a time at which the arbitrary AP is detected, as a boundary time point; and
to record information for causing a radio wave intensity, which has the information on measurement time closest to the boundary time point determined by reflecting the offset time among measured intensities stored in the storage unit, to be identified as an intensity measured at a start position of a platform.

10. The apparatus of claim 9, wherein the control unit is further configured to uniquely identify the platform where the arbitrary AP is installed, and to use time information pre-designated for the identified platform as the offset time.

11. The apparatus of claim 2, further comprising a sensor for detecting magnitude of acceleration acting on the apparatus,
wherein the control unit is further configured to determine the boundary time point, in case a distribution locus of DUBs matching with the intrinsic pattern is detected from any one of DUB distribution tables being organized, by applying length of the time interval differently depending on an additional condition of whether steady change of the acceleration magnitude for a predetermined time or more is detected before or after a detection time of the distribution locus.

12. The apparatus of claim 2, further comprising:
a photographing unit configured to take pictures outside a window of an electric train; and
an image analyzing unit configured to obtain a motion vector of an image frame from the pictures being taken,
wherein the control unit is configured to determine the boundary time point, in case a distribution locus of DUBs matching with the intrinsic pattern is detected from any one of DUB distribution tables being organized, by applying length of the time interval differently depending on an additional condition of whether the motion vectors being obtained sequentially before or after a detection time of the distribution locus are steadily changed in magnitude for a predetermined time or more.

13. The apparatus of claim 4, wherein the control unit is configured to apply the time interval to determination of the boundary time point after setting the time interval to be longer when the additional condition is not satisfied as compared with when the additional condition is satisfied.

14. The apparatus of claim 1, wherein the target band is set to have a bandwidth narrower than entire bandwidth of the frequency distribution information for audible sounds being obtained by the sound analyzing unit.

15. The apparatus of claim 2, wherein the control unit is configured to be capable of applying the time interval to determination of the boundary time point after setting the time interval differently depending on order of an carriage, on an electric train, where the apparatus is placed for measuring a radio wave.

16. The apparatus of claim 2, further comprising a radio wave measuring unit that is detachably connected to the apparatus and is configured to measure intensity of a radio wave and to transmit the measured intensity to the control unit,
wherein the radio wave measuring unit is configured to measure intensity of a low frequency electromagnetic wave, which is abbreviatedly called as ELF or ELFMW.

17. The apparatus of claim 2, further comprising a radio wave measuring unit that is integrated into the apparatus and is configured to measure intensity of a radio wave and to transmit the measured intensity to the control unit,
wherein the radio wave measuring unit is configured to measure intensity of radio signals for providing mobile communication.

18. The apparatus of claim 1, wherein the control unit is configured to organize the DUB distribution table in such a manner that a predetermined ratio of the DUB distribution table includes pieces of frequency distribution information having been included in latter portion of a DUB distribution table organized just before.

19. A method, conducted by an apparatus to be moved with an moving object, for using sounds generated in surroundings, the method comprising:
a first step of obtaining, every predetermined interval, frequency distribution information of the sounds for the predetermined interval;
a second step of searching each of subbands divided from a target band set with respect to the frequency distribution information obtained periodically to find a unit band corresponding to a maximum frequency component among unit bands, each with a designated bandwidth, pertaining to said each subband, marking the found unit band as a Dominant DUB, and organizing a DUB distribution table by collecting a plural pieces of the frequency distribution information as much as a predetermined time, each of said plural pieces of the frequency distribution information, in the DUB distribution table, consisting of the subbands, each containing the marked DUB;
a third step of checking a distribution locus of DUBs on the organized DUB distribution table in order to confirm whether the distribution locus matches with any one of intrinsic patterns preset respectively for specific sounds; and
a fourth step of determining that one of the specific sounds has been generated, if it is confirmed that the distribution locus of DUBs matches with said any one intrinsic pattern, and determining the moving object to be in a particular movement state corresponding to said one specific sound,
wherein the specific sounds are sounds to be generated depending on movement state of the moving object.

20. The method of claim 19, further comprising a step of continuously measuring intensity of a received radio wave, and storing each measured intensity together with information on a corresponding measurement time,
wherein the moving object is an electric train, and
wherein the fourth step further comprises: determining, in case of determining the moving object to be in the particular movement state corresponding to said one specific sound, a time point later by a designated time interval, based on a time at which one DUB distribution table is organized, as a boundary time point, said one DUB distribution table being a table including the distribution locus of DUBs on which the determination of the particular movement state is based; and recording information for causing an intensity, which has the information on measurement time closest to the determined boundary time point among the stored intensities, to be identified as an intensity measured at the start position of a platform or a tunnel section.

* * * * *